(12) United States Patent
Honda

(10) Patent No.: US 7,629,608 B2
(45) Date of Patent: Dec. 8, 2009

(54) LIGHT-EMITTING ELEMENT, DISPLAY DEVICE, AND ELECTRONIC APPLIANCE

(75) Inventor: Tatsuya Honda, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 237 days.

(21) Appl. No.: 11/687,332

(22) Filed: Mar. 16, 2007

(65) Prior Publication Data
US 2007/0221945 A1 Sep. 27, 2007

(30) Foreign Application Priority Data
Mar. 21, 2006 (JP) .............. 2006-077854
Apr. 5, 2006 (JP) .............. 2006-104328

(51) Int. Cl.
*H01L 29/10* (2006.01)
(52) U.S. Cl. .................. 257/43; 257/E33.019
(58) Field of Classification Search ............. 257/43, 257/E33.019
See application file for complete search history.

(56) References Cited

U.S. PATENT DOCUMENTS

| 2,743,239 | A | | 4/1956 | Froelich |
| 3,786,315 | A | | 1/1974 | Mead et al. |
| 4,751,427 | A | * | 6/1988 | Barrow et al. .............. 313/503 |
| 5,006,277 | A | | 4/1991 | Yoneshima et al. |
| 5,087,531 | A | | 2/1992 | Terada et al. |
| 5,102,579 | A | | 4/1992 | Inaho et al. |
| 5,239,228 | A | | 8/1993 | Taniguchi et al. |
| 5,314,759 | A | | 5/1994 | Harkonen et al. |
| 5,356,657 | A | | 10/1994 | Terada et al. |
| 5,648,181 | A | | 7/1997 | Watanabe |
| 6,046,465 | A | | 4/2000 | Wang et al. |
| 6,259,138 | B1 | | 7/2001 | Ohtani et al. |
| 6,342,313 | B1 | | 1/2002 | White et al. |
| 6,428,207 | B1 | | 8/2002 | Steklenski et al. |
| 6,429,448 | B1 | | 8/2002 | Moore et al. |
| 6,597,106 | B2 | | 7/2003 | Toth et al. |

(Continued)

FOREIGN PATENT DOCUMENTS

EP 1 521 505 4/2005

(Continued)

OTHER PUBLICATIONS

Noboru Miura et al.; "High Luminance Blue-Emitting $BaAl_2S_4$:Eu Thin-Film Electroluminescent Devices"; *Jpn. J. Appl. Phys.* vol. 38, Part 2, No. 11B; pp. L1291-L1292; 1999.

(Continued)

*Primary Examiner*—Trung Dang
(74) *Attorney, Agent, or Firm*—Fish & Richardson P.C.

(57) ABSTRACT

An object is to provide an inorganic light-emitting element capable of low-voltage driving. Moreover, another object is to provide a display device and an electronic appliance with low power consumption by using this light-emitting element. The light-emitting element includes a layer containing a light-emitting substance and an electron supplying layer which is in contact with the layer containing a light-emitting substance, between a first electrode and a second electrode. The layer containing a light-emitting substance includes at least an impurity element and a base material which is a sulfide, an oxide, or a nitride. The electron supplying layer includes a substance with a lower work function than that of the base material.

19 Claims, 15 Drawing Sheets

U.S. PATENT DOCUMENTS

| | | |
|---|---|---|
| 6,597,108 B2 | 7/2003 | Yano et al. |
| 6,682,664 B1 | 1/2004 | Chen et al. |
| 6,687,266 B1 | 2/2004 | Ma et al. |
| 6,770,221 B1 | 8/2004 | Chen et al. |
| 6,771,019 B1 * | 8/2004 | Wu et al. .................. 313/503 |
| 6,939,482 B2 | 9/2005 | Miura et al. |
| 6,982,124 B2 | 1/2006 | Abdul et al. |
| 7,151,338 B2 | 12/2006 | Hoffman |
| 7,176,616 B2 | 2/2007 | Yamashita |
| 2003/0234609 A1 * | 12/2003 | Aziz et al. ................. 313/504 |
| 2004/0063877 A1 | 4/2004 | Starzewski et al. |
| 2004/0169160 A1 | 9/2004 | Watabe et al. |
| 2004/0174117 A1 | 9/2004 | Han |
| 2005/0073246 A1 | 4/2005 | Hoffman |
| 2005/0140272 A1 | 6/2005 | Shirata |
| 2005/0189518 A1 | 9/2005 | Arakawa et al. |
| 2006/0181197 A1 | 8/2006 | Nago et al. |
| 2006/0192486 A1 | 8/2006 | Ogawa |
| 2007/0096646 A1 * | 5/2007 | Van Nice et al. ........... 313/509 |
| 2007/0176535 A1 | 8/2007 | Sakata |
| 2007/0176536 A1 | 8/2007 | Sakata et al. |
| 2007/0194321 A1 | 8/2007 | Yamazaki et al. |
| 2007/0194334 A1 | 8/2007 | Honda |
| 2007/0205410 A1 | 9/2007 | Ikeda et al. |
| 2007/0205416 A1 | 9/2007 | Sakata et al. |
| 2007/0205417 A1 | 9/2007 | Ohara et al. |
| 2007/0205428 A1 | 9/2007 | Katayama et al. |
| 2007/0215880 A1 | 9/2007 | Sakata et al. |
| 2007/0216293 A1 | 9/2007 | Yokoyama et al. |
| 2007/0221888 A1 | 9/2007 | Sakata |

FOREIGN PATENT DOCUMENTS

| | | |
|---|---|---|
| JP | 06-096861 | 4/1994 |
| JP | 2001-250691 | 9/2001 |
| JP | 2003-173878 | 6/2003 |
| JP | 2004-207246 | 7/2004 |
| JP | 2005-038634 | 2/2005 |
| JP | 2005-116529 | 4/2005 |
| JP | 2005-336275 | 12/2005 |
| JP | 2006-505956 | 2/2006 |
| WO | WO2004-045002 | 5/2004 |

OTHER PUBLICATIONS

International Search Report (Application No. PCT/JP2007/055162), dated May 15, 2007, 3 pages.

Written Opinion (Application No. PCT/JP2007/055162), dated May 15, 2007, 4 pages.

* cited by examiner

200

220

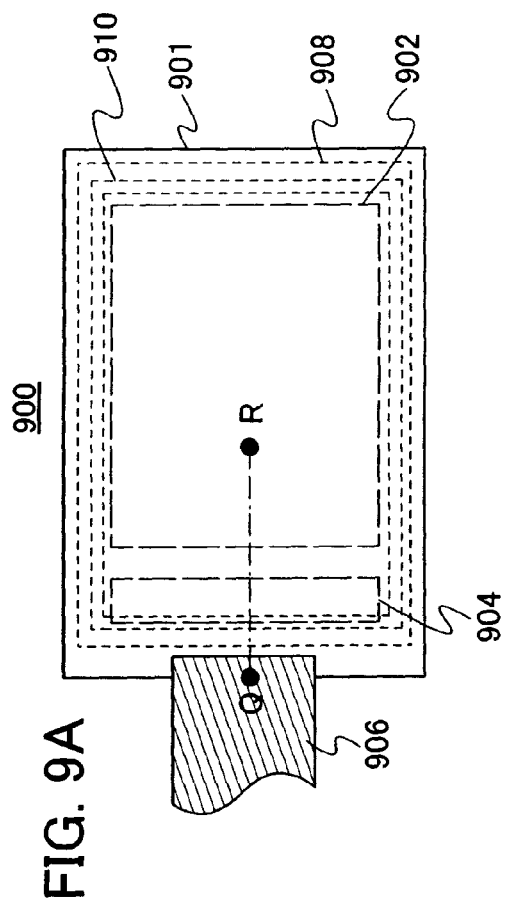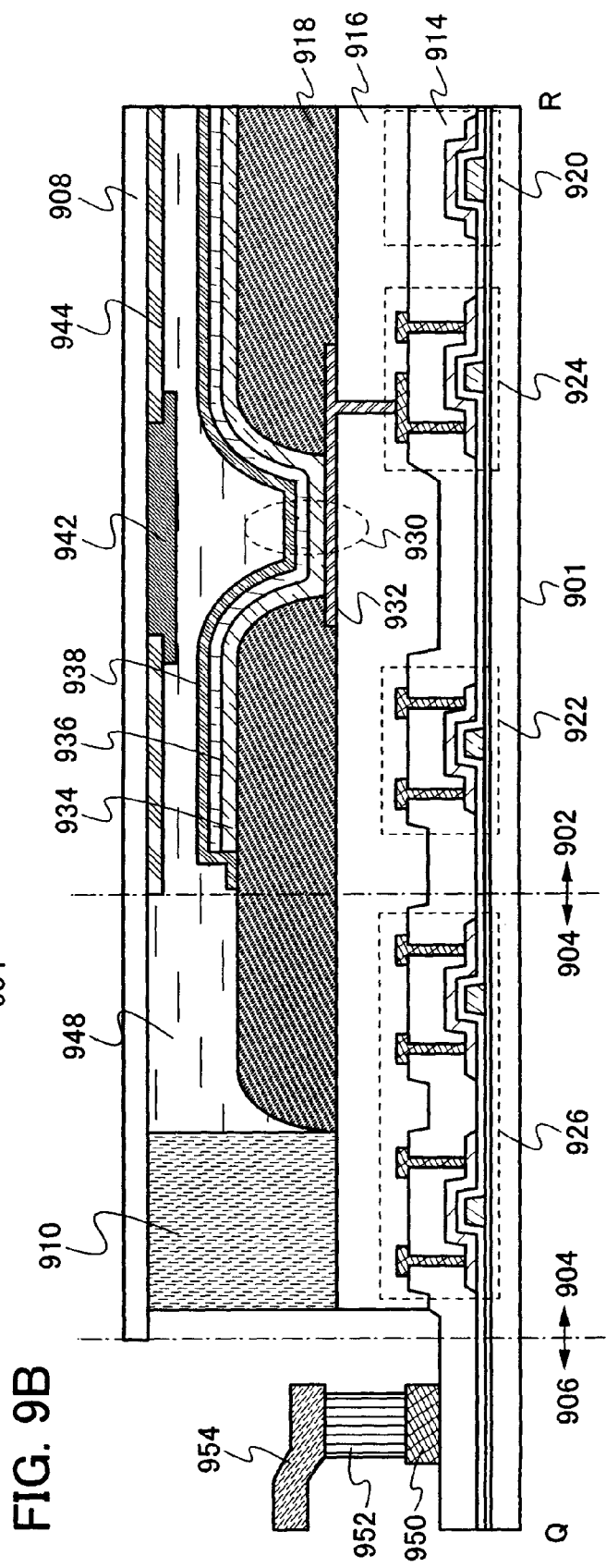
FIG. 9A
FIG. 9B

LIGHT-EMITTING ELEMENT, DISPLAY DEVICE, AND ELECTRONIC APPLIANCE

TECHNICAL FIELD

The present invention relates to a light-emitting element utilizing electroluminescence. In addition, the present invention relates to a display device and an electronic appliance each having a light-emitting element.

BACKGROUND ART

In recent years, research and development have been extensively conducted on light-emitting elements utilizing electroluminescence (EL). In a basic structure of such a light-emitting element, a substance with a light-emitting property is interposed between a pair of electrodes. By application of voltage between the electrodes, light emission can be obtained from the substance with a light-emitting property.

Since such a light-emitting element is of a self-light-emitting type, the light-emitting element has advantages over a liquid crystal display in that the viewing angle is wide and the visibility is high, and moreover the response speed is high and reduction in thickness and weight is possible.

Light-emitting elements utilizing electroluminescence are classified according to whether a substance with a light-emitting property is an organic compound or an inorganic compound. In general, the former is referred to as an organic light-emitting element, and the latter as an inorganic light-emitting element. These light-emitting elements are different from each other not only in their substances with a light-emitting property but also in their light-emitting mechanisms and features.

Among these light-emitting elements, an inorganic light-emitting element 1500 having a double insulating structure is known in which a light-emitting layer 1506 is sandwiched by insulating layers (a first insulating layer 1504 and a second insulating layer 1508) between a pair of electrodes (a first electrode 1502 and a second electrode 1510) as shown in FIG. 15. Such an inorganic light-emitting element provides light emission by application of AC voltage between the pair of electrodes (for example, see Reference 1: Japanese Published Patent Application No. H6-96861).

Inorganic light-emitting elements are classified according to their element structures into a dispersed inorganic light-emitting element and a thin-film inorganic light-emitting element. They are different from each other in that the former includes a light-emitting layer in which particles of a light-emitting material are dispersed in a binder and the latter includes a light-emitting layer formed of a thin film of a light-emitting material. However, they are common in that they require electrons accelerated by a high electric field.

Note that light emission mechanisms of the inorganic light-emitting elements include localized light emission which utilizes inner-shell electron transition of metal ions and donor-acceptor recombination light emission which utilizes a donor level and an acceptor level. In general, it is often the case that thin-film inorganic light-emitting elements employ localized light emission, and dispersed inorganic light-emitting elements employ donor-acceptor recombination light emission.

Since the inorganic light-emitting elements have a light emission mechanism by which light emission is obtained by collisional excitation of an electron accelerated by a high electric field against light emission center, a voltage of several hundred volts needs to be applied to the inorganic light-emitting elements. This causes a problem of increase in drive voltage in a case of applying the inorganic light-emitting element to a display panel and the like.

In order to solve the aforementioned problem, various element structures have been examined. For example, Reference 2 (Japanese Published Patent Application No. 2004-207246) suggests an element structure which aims at capturing a large amount of charges on a surface of a dielectric layer and decreasing drive voltage by providing an electric field enhancing layer made of carbon nanotube between a dielectric layer and an electrode.

DISCLOSURE OF INVENTION

The present invention has been made in view of such circumstances, and it is an object of the present invention to provide an inorganic light-emitting element capable of low-voltage driving. Moreover, it is an object of the present invention to provide a display device and an electronic appliance each with reduced power consumption by using this light-emitting element.

In order to solve the above problem, a light-emitting element of the present invention includes a layer containing a light-emitting substance and an electron supplying layer which is in contact with the layer containing a light-emitting substance. The layer containing a light-emitting substance and the electron supplying layer are provided between a first electrode and a second electrode. The layer containing a light-emitting substance includes at least an impurity element and a base material which is a sulfide, an oxide, or a nitride. The electron supplying layer includes a substance with a lower work function than that of the base material.

Another structure of a light-emitting element of the present invention includes a layer containing a light-emitting substance, an electron supplying layer which is in contact with one surface of the layer containing a light-emitting substance, and an insulating layer which is in contact with the other surface of the layer containing a light-emitting substance. The layer containing a light-emitting substance, the electron supplying layer, and the insulating layer are provided between a first electrode and a second electrode. The layer containing a light-emitting substance includes at least an impurity element and a base material which is a sulfide, an oxide, or a nitride. The electron supplying layer includes a substance with a lower work function than that of the base material.

The light-emitting element of the present invention includes any of manganese (Mn), copper (Cu), samarium (Sm), terbium (Tb), erbium (Er), thulium (Tm), europium (Eu), cerium (Ce), and praseodymium (Pr) as the impurity element.

Another structure of a light-emitting element of the present invention includes a layer containing a light-emitting substance and an electron supplying layer which is in contact with the layer containing a light-emitting substance. The layer containing a light-emitting substance and the electron supplying layer are provided between a first electrode and a second electrode. The layer containing a light-emitting substance includes at least a first impurity element, a second impurity element, and a base material which is a sulfide, an oxide, or a nitride. The electron supplying layer includes a substance with a lower work function than that of the base material.

Another structure of a light-emitting element of the present invention includes a layer containing a light-emitting substance, an electron supplying layer which is in contact with one surface of the layer containing a light-emitting substance, and an insulating layer which is in contact with the other surface of the layer containing a light-emitting substance. The layer containing a light-emitting substance, the electron supplying layer, and the insulating layer are provided between a first electrode and a second electrode. The layer containing a light-emitting substance includes at least a first impurity element, a second impurity element, and a base material which is a sulfide, an oxide, or a nitride. The electron supplying layer includes a substance with a lower work function than that of the base material.

Another structure of a light-emitting element of the present invention includes a layer containing a light-emitting substance, an electron supplying layer which is in contact with one surface of the layer containing a light-emitting substance, and a hole supplying layer which is in contact with the other surface of the layer containing a light-emitting substance. The layer containing a light-emitting substance, the electron supplying layer, and the hole supplying layer are provided between a first electrode and a second electrode. The layer containing a light-emitting substance includes at least a first impurity element, a second impurity element, and a base material which is a sulfide, an oxide, or a nitride. The electron supplying layer includes a substance with a lower work function than that of the base material, and the hole supplying layer includes a substance with a higher work function than that of the base material.

In the light-emitting element of the present invention, the hole supplying layer includes a substance with a work function of 4.5 eV or higher.

The hole supplying layer of the light-emitting element of the present invention includes one or more substances selected from beryllium (Be), boron (B), iron (Fe), chromium (Cr), copper (Cu), antimony (Sb), tellurium (Te), tungsten (W), cobalt (Co), nickel (Ni), selenium (Se), palladium (Pd), iridium (Ir), platinum (Pt), gold (Au), and the like, and a compound of any of these elements.

The light-emitting element of the present invention includes any of fluorine (F), chlorine (Cl), and aluminum (Al) as the first impurity element.

The light-emitting element of the present invention includes copper (Cu) or silver (Ag) as the second impurity element.

The light-emitting element of the present invention further includes manganese (Mn) as a third impurity element in the layer containing a light-emitting substance.

The base material of the light-emitting element of the present invention is any of zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), zinc oxide (ZnO), yttrium oxide ($Y_2O_3$), aluminum nitride (AlN), gallium nitride (GaN), indium nitride (InN), zinc selenide (ZnSe), zinc telluride (ZnTe), $CaGa_2S_4$, $SrGa_2S_4$, $BaGa_2S_4$, $BaAl_2S_4$, $CaAl_2S_4$, and $SrCaY_2S_4$.

In the light-emitting element of the present invention, the electron supplying layer includes a substance with a work function of 4 eV or lower.

The electron supplying layer of the light-emitting element of the present invention includes one or more substances selected from an alkali metal such as lithium (Li), sodium (Na), potassium (K), or cesium (Cs), an alkaline earth metal such as magnesium (Mg), calcium (Ca), strontium (Sr), or barium (Ba), scandium (Sc), arsenic (As), yttrium (Y), lanthanum (La), hafnium (Hf), and the like, and a compound of any of these elements.

The electron supplying layer of the light-emitting element of the present invention includes a substance with negative electron affinity such as diamond or aluminum nitride (AlN).

The present invention includes in its category a display device having the aforementioned light-emitting element.

The display device in this specification includes in its category an image display device, a light-emitting device, and a light source (including an illumination apparatus). Further, the display device includes a module in which a connector such as an FPC (Flexible Printed Circuit), a TAB (Tape Automated Bonding) tape, or a TCP (Tape Carrier Package) attached to a panel where the light-emitting element is formed; a module in which a printed wiring board is provided at an end of a TAB tape or an TCP; and a module in which an IC (Integrated Circuit) is directly mounted on a panel where a light-emitting element is formed, by a COG (Chip On Glass) method.

An electronic appliance using the light-emitting element of the present invention in its display portion is also included in the category of the present invention. Therefore, the electronic appliance of the present invention has a display portion, and the display portion is provided with the aforementioned light-emitting element and a controller for controlling light emission of the light-emitting element.

Since the light-emitting element of the present invention has high luminous efficiency and attains target luminance with less electric power, the drive voltage can be decreased.

Further, since the display device and the electronic appliance of the present invention each include the light-emitting element having high luminous efficiency and operating at low drive voltage, the power consumption thereof can be reduced.

BRIEF DESCRIPTION OF DRAWINGS

In the accompanying drawings:

FIGS. 9A and 9B show an example of a display device of the present invention;

BEST MODE FOR CARRYING OUT THE INVENTION

Embodiment modes for implementing the present invention are hereinafter described with reference to the drawings. However, since the present invention can be embodied with many different modes, it is easily understood by those skilled in the art that the mode and detail can be variously changed without departing from the scope and spirit of the present invention. Therefore, the present invention is not construed as being limited to the description of the embodiment modes.

EMBODIMENT MODE 1

An example of a light-emitting element of the present invention is explained with reference to FIGS. 1A and 1B.

Figure 1A:
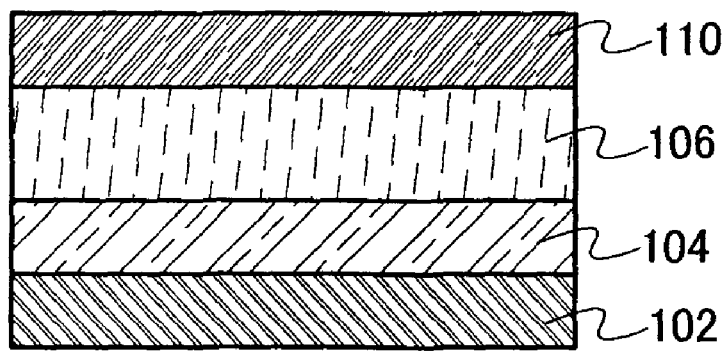
FIGS. 1A and 1B each show an example of a light-emitting element of the present invention.

A light-emitting element 100 shown in FIG. 1A has a structure in which a first electrode 102, an electron supplying layer 104, a layer 106 containing a light-emitting substance, and a second electrode 110 are sequentially stacked. That is, in this structure, the layer 106 containing a light-emitting substance and the electron supplying layer 104 which is in contact with the layer 106 containing a light-emitting substance are interposed between the first electrode 102 and the second electrode 110.

The layer 106 containing a light-emitting substance includes a light-emitting material formed of at least a base material and an impurity element. The impurity element does not include an element included in the base material.

The base material in the layer 106 containing a light-emitting substance may be a sulfide, an oxide, or a nitride. For example, the sulfide may be zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like. The oxide may be zinc oxide (ZnO), yttrium oxide ($Y_2O_3$), or the like. The nitride may be aluminum nitride (AlN), gallium nitride (GaN), indium nitride (InN), or the like. In addition, zinc selenide (ZnSe), zinc telluride (ZnTe), or the like can also be used. Further, a ternary mixed crystal such as $CaGa_2S_4$, $SrGa_2S_4$, $BaGa_2S_4$, $BaAl_2S_4$, $CaAl_2S_4$, or $SrCaY_2S_4$ can also be used.

The impurity element to be included in the layer 106 containing a light-emitting substance is different between a case of localized light emission which utilizes inner-shell electron transition of metal ions and a case of donor-acceptor recombination light emission which utilizes a donor level and an acceptor level.

When the layer 106 containing a light-emitting substance is of a localized light emission type, for example, the impurity element may be manganese (Mn), copper (Cu), samarium (Sm), terbium (Tb), erbium (Er), thulium (Tm), europium (Eu), cerium (Ce), praseodymium (Pr), or the like. It is to be noted that a halogen element such as fluorine (F) or chlorine (Cl) may be added for charge compensation.

On the other hand, when the layer 106 containing a light-emitting substance is of a donor-acceptor recombination light emission type, a first impurity element and a second impurity element are included as the impurity element. One of the first impurity element and the second impurity element forms a donor level while the other forms an acceptor level. The first impurity element may be, for example, fluorine (F), chlorine (Cl), aluminum (Al), or the like. The second impurity element may be, for example, copper (Cu), silver (Ag), or the like. Moreover, manganese (Mn) or the like can be introduced as a third impurity element in the layer 106 containing a light-emitting substance.

The electron supplying layer 104 is formed of a substance with a lower work function than that of the base material of the layer 106 containing a light-emitting substance. It is to be noted that many of substances used for the aforementioned base material have a work function of about 4 eV to 4.5 eV. Therefore, the electron supplying layer 104 is preferably formed of a substance with a work function of 4 eV or lower.

Specifically, a substance which includes one or more selected from an alkali metal such as lithium (Li), sodium (Na), potassium (K), or cesium (Cs), an alkaline earth metal such as magnesium (Mg), calcium (Ca), strontium (Sr), or barium (Ba), scandium (Sc), arsenic (As), yttrium (Y), lanthanum (La), hafnium (Hf), and the like, and a compound of any of these elements can be used.

The electron supplying layer 104 may include a substance with negative electron affinity such as diamond or aluminum nitride (AlN).

The first electrode 102 and the second electrode 110 can be formed of various kinds of metals, alloys, or electrically conductive compounds, or a mixture thereof. For example, indium tin oxide (ITO), ITO containing silicon, indium zinc oxide (IZO) in which 2 wt % to 20 wt % of zinc oxide (ZnO) is mixed with indium oxide, ZnO to which Ga, Al, or the like is added, or the like can be used. In addition, a conductive metal such as aluminum (Al), molybdenum (Mo), silver (Ag), platinum (Pt), tungsten (W), titanium (Ti), tantalum (Ta), gold (Au), nickel (Ni), chromium (Cr), iron (Fe), cobalt (Co), copper (Cu), or palladium (Pd) can be used. Moreover, aluminum-silicon (AlSi), aluminum-titanium (AlTi), tungsten nitride (WN), tantalum nitride (TaN), or the like can also be used. It is preferable that, as shown in this embodiment mode, the first electrode 102 be formed of a substance with a low work function (for example, a substance with a work function of 4 eV or lower) when the electron supplying layer 104 is formed in contact with the first electrode 102.

Light emitted from the layer 106 containing a light-emitting substance is extracted to the outside through one or both of the first electrode 102 and the second electrode 110. Therefore, at least one of the first electrode 102 and the second electrode 110 has a light-transmitting property.

In the present invention, by providing the electron supplying layer in contact with the layer containing a light-emitting substance, carriers (electrons) can be efficiently supplied to the layer containing a light-emitting substance. Thus, the light-emitting element has higher luminous efficiency and lower drive voltage.

Figure 1B:
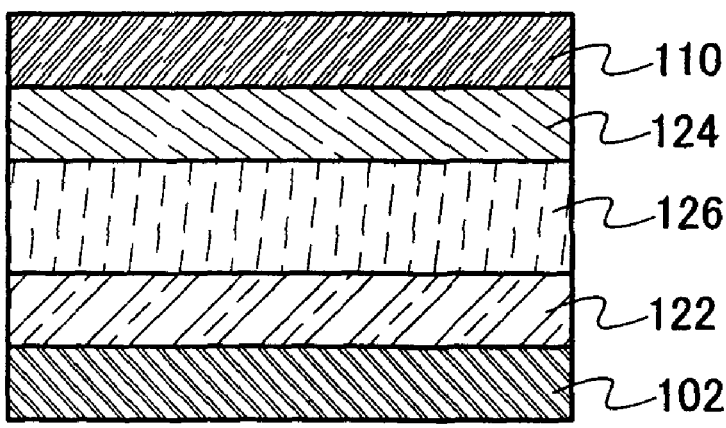

Next, a light-emitting element 120 shown in FIG. 1B is explained. The light-emitting element 120 has a structure in which the first electrode 102, an electron supplying layer 122, a layer 126 containing a light-emitting substance, a hole supplying layer 124, and the second electrode 110 are sequentially stacked. That is, in this structure, the layer 126 containing a light-emitting substance, the electron supplying layer 122 which is contact with one surface of the layer 126 containing a light-emitting substance, and the hole supplying layer 124 which is in contact with the other surface of the layer 126 containing a light-emitting substance are interposed between the first electrode 102 and the second electrode 110.

Since the structure of the light-emitting element 120 shown in FIG. 1B except the layer 126 containing a light-emitting substance, the electron supplying layer 122, and the hole supplying layer 124 is based on that of the light-emitting element 100 shown in FIG. 1A, the description is made simply. The light-emitting element 120 shown in FIG. 1B provides donor-acceptor recombination light emission.

The layer 126 containing a light-emitting substance includes a light-emitting material formed of at least a base material, a first impurity element, and a second impurity element. One of the first impurity element and the second impurity element forms a donor level while the other forms an acceptor level.

The base material included in the layer 126 containing a light-emitting substance can be the same as that in the aforementioned layer 106 containing a light-emitting substance;

therefore, the description is omitted. The first impurity element may be, for example, fluorine (F), chlorine (Cl), aluminum (Al), or the like. The second impurity element may be, for example, copper (Cu), silver (Ag), or the like. Moreover, manganese (Mn) or the like can be introduced as a third impurity element in the layer 126 containing a light-emitting substance.

The electron supplying layer 122 is formed of a substance with a lower work function than that of the base material included in the layer 126 containing a light-emitting substance. It is to be noted that many of substances used for the aforementioned base material have a work function of about 4 eV to 4.5 eV. Therefore, the electron supplying layer 122 is preferably formed of a substance with a work function of 4 eV or lower. Specifically, a substance which includes one or more selected from an alkali metal such as lithium (Li), sodium (Na), potassium (K) or cesium (Cs), an alkaline earth metal such as magnesium (Mg), calcium (Ca), strontium (Sr), or barium (Ba), scandium (Sc), arsenic (As), yttrium (Y), lanthanum (La), hafnium (Hf), and the like, and a compound of any of these elements can be used.

The electron supplying layer 122 may include a substance with negative electron affinity such as diamond or aluminum nitride (AlN).

The hole supplying layer 124 is formed of a substance with a higher work function than that of the base material included in the layer 126 containing a light-emitting substance. It is to be noted that many of substances used for the base material have a work function of about 4 eV to 4.5 eV. Therefore, the hole supplying layer 124 is preferably formed of a substance with a work function of 4.5 eV or higher. Specifically, a substance including one or more selected from beryllium (Be), boron (B), iron (Fe), chromium (Cr), copper (Cu), antimony (Sb), tellurium (Te), tungsten (W), cobalt (Co), nickel (Ni), selenium (Se), palladium (Pd), iridium (Ir), platinum (Pt), gold (Au), and the like, and a compound of any of these elements can be used.

The first electrode 102 and the second electrode 110 are similar to those of the light-emitting element 100 and can be formed of various kinds of metals, alloys, or electrically conductive compounds, or a mixture thereof. When the electron supplying layer 122 is provided in contact with the first electrode 102, the first electrode 102 is preferably formed of a substance with a low work function (for example, a substance with a work function of 4 eV or lower).

Although the electron supplying layer 122 is interposed between the first electrode 102 and the layer 126 containing a light-emitting substance and the hole supplying layer 124 is interposed between the layer 126 containing a light-emitting substance and the second electrode 110 in this embodiment mode, the present invention is not limited to this. For example, the hole supplying layer 124 may be interposed between the first electrode 102 and the layer 126 containing a light-emitting substance and the electron supplying layer 122 may be interposed between the layer 126 containing a light-emitting substance and the second electrode 110. That is to say, the hole supplying layer 124 may be in contact with the first electrode 102 and the electron supplying layer 122 may be in contact with the second electrode 110. In this case, the first electrode 102 is preferably formed of a substance with a high work function (for example, a substance with a work function of 4.5 eV or higher).

In the present invention, by providing the electron supplying layer and the hole supplying layer both in contact with the layer containing a light-emitting substance, carriers (electrons and holes) can be supplied efficiently to the layer containing a light-emitting substance. Therefore, the light-emitting element can have higher luminous efficiency and lower drive voltage.

The light-emitting element shown in this embodiment mode provides light emission by application of voltage between the pair of electrodes (the first and second electrodes) which sandwiches the layer containing a light-emitting substance. At this time, the voltage applied to the two electrodes of the light-emitting element may be any of AC voltage, DC voltage, and pulsed voltage.

Next, an example of a manufacturing method of the light-emitting element shown in each of FIGS. 1A and 1B is explained.

The case of the light-emitting element 100 shown in FIG. 1A is explained. First, the first electrode 102 is formed over a substrate. The substrate, which is not shown here, is used as a support base for the light-emitting element 100. The substrate may be a glass substrate, a substrate made of an insulating substance such as alumina, or the like. In addition to those, a plastic substrate having heat resistance to withstand processing temperature in later steps, a silicon substrate, or the like can also be used. Other substrates may be used as long as they can function as a support base during manufacturing steps of the light-emitting element 100.

The first electrode 102 can be formed of the aforementioned metal, alloy, electrically conductive compound, mixture of these, or the like by a sputtering method, a vacuum evaporation method, a CVD method, a sol-gel method, or the like. The film thickness of the first electrode 102 is not particularly limited; however, it is preferably in the range of 100 nm to 500 nm. Even when the first electrode 102 is formed of a material with low transmittance of visible light, the first electrode 102 can be used as a light-transmitting electrode by setting the film thickness in the range of about 1 nm to 50 nm, preferably 5 nm to 20 nm.

Subsequently, the electron supplying layer 104 is formed over the first electrode 102. The electron supplying layer 104 can be formed of a substance with a lower work function than that of the base material included in the layer 106 containing a light-emitting substance to be formed later, by a sputtering method, a vacuum evaporation method, a CVD method, a sol-gel method, or the like. The electron supplying layer 104 may include a substance with negative electron affinity such as diamond or aluminum nitride (AlN). The film thickness of the electron supplying layer 104 is not particularly limited; however, it is preferably in the range of 100 nm to 500 nm.

Next, the layer 106 containing a light-emitting substance is formed over the electron supplying layer 104. First, a manufacturing method of a light-emitting material included in the layer 106 containing a light-emitting substance is explained.

The light-emitting material included in the layer 106 containing a light-emitting substance is formed of the base material and the impurity element as aforementioned. By changing the impurity element to be included, light emission with various colors can be obtained. As a manufacturing method of the light-emitting material, various methods such as a solid phase method and a liquid phase method (coprecipitation method) can be used. In addition, a liquid phase method such as a spray pyrolysis method, a double decomposition method, a method by precursor pyrolysis, a reverse micelle method, a method in which any of these methods is combined with high-temperature baking, or a freeze-drying method can be used.

In the solid phase method, a base material and an impurity element or a compound including the impurity element are weighed, mixed in a mortar, and reacted with each other by being heated and baked in an electric furnace so that the impurity element is included in the base material. The baking temperature is preferably in the range of 700° C. to 1500° C. This is because solid-phase reaction does not progress when baking temperature is too low and the base material is decomposed when baking temperature is too high. The baking may be performed in a powder state; however, it is preferable to perform baking in a pellet state. This method requires baking at a relatively high temperature but is simple; thus, this method has high productivity and is suitable for mass production.

In the liquid phase method (coprecipitation method), a base material or a compound including the base material, and an impurity element or a compound including the impurity element are reacted with each other in a solution and dried, and thereafter, they are baked. In this method, particles of the light-emitting material are uniformly dispersed, the particles each have a small diameter, and the reaction can progress even at low baking temperature.

It is to be noted that when the light emission from the layer 106 containing a light-emitting substance is donor-acceptor recombination light emission the light-emitting material includes plural kinds of impurity elements. In the case of synthesizing the light-emitting material of a donor-acceptor recombination light emission type by a solid phase method, the base material, the first impurity element or a compound including the first impurity element, and the second impurity element or a compound including the second impurity element are weighed and mixed in a mortar. Then, the mixture is heated and baked in an electric furnace. The aforementioned substances can be used as the base material, the first impurity element, and the second impurity element. Moreover, for example, aluminum sulfide ($Al_2S_3$) or the like can be used as the compound including the first impurity element, and copper sulfide ($Cu_2S$), silver sulfide ($Ag_2S$), or the like can also be used as the compound including the second impurity element.

When the light-emitting material of a donor-acceptor recombination light emission type is synthesized by the solid phase method as aforementioned, a compound including the first impurity element and the second impurity element may be used in combination. In this case, the impurity elements are easily diffused to promote solid-phase reaction; therefore, a uniform light-emitting material can be obtained. In addition, since no excessive impurity elements are mixed, a light-emitting material with high purity can be obtained. As the compound including the first impurity element and the second impurity element, for example, copper chloride (CuCl), silver chloride (AgCl), or the like can be used.

Subsequently, the layer 106 containing a light-emitting substance is formed using the light-emitting material obtained as above. When the light-emitting element 100 of the present invention is of a thin film type, the layer 106 containing a light-emitting substance can be formed of the aforementioned light-emitting material by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like. Although the film thickness is not particularly limited, it is preferably in the range of 100 nm to 1000 nm.

On the other hand, when the light-emitting element 100 of the present invention is of a dispersed type, the layer 106 containing a light-emitting substance is formed in such a way that the aforementioned light-emitting material is processed into a particle form, and the light-emitting material is dispersed in a binder to have a film shape. If a particle with a desired size cannot be obtained because of a manufacturing method of the light-emitting material, the light-emitting material may be processed into a particle form by being crushed in a mortar or the like. The binder is a substance used for fixing the light-emitting material of a particle form in a dispersed state and keeping a shape thereof as a film. The light-emitting material is dispersed uniformly by the binder and fixed. Such a film can be formed by a droplet discharging method, a printing method (such as screen printing or offset printing), a coating method such as a spin coating method, a dipping method, a dispenser method, or the like. The film thickness is not particularly limited; however, it is preferably in the range of 100 nm to 1000 nm.

As the binder that can be used for the light-emitting element 100 of a dispersed type, an organic material, an inorganic material, or a mixed material of an organic material and an inorganic material can be used. As the organic material, the following resin can be used: a polymer having a relatively high dielectric constant, such as a cyanoethyl cellulose based resin, polyethylene, polypropylene, a polystyrene based resin, a silicone resin, an epoxy resin, vinylidene fluoride, or the like. In addition, a heat-resistant high-molecular material such as aromatic polyamide or polybenzimidazol, or a siloxane resin may also be used. The siloxane resin corresponds to a resin including a Si—O—Si bond. Siloxane has a skeletal structure formed of a bond of silicon (Si) and oxygen (O). For a substituent, an organic group containing at least hydrogen (for example, an alkyl group or aromatic hydrocarbon) is used. Alternatively, a fluoro group may be used for a substituent. In addition, for a substituent, both a fluoro group and an organic group containing at least hydrogen may also be used. Further, the following resin material may also be used: a vinyl resin such as polyvinyl alcohol or polyvinyl-butyral, a phenol resin, a novolac resin, an acrylic resin, a melamine resin, a urethane resin, an oxazole resin (polybenzoxazole), or the like. Microparticles having a high dielectric constant such as barium titanate ($BaTiO_3$) or strontium titanate ($SrTiO_3$) can also be mixed to these resins appropriately, whereby a dielectric constant is adjusted.

As the inorganic material that can be used for the binder, the following can be given: silicon oxide ($SiO_x$), silicon nitride ($SiN_x$), silicon including oxygen and nitrogen, aluminum nitride (AlN), aluminum including oxygen and nitrogen, aluminum oxide ($Al_2O_3$), titanium oxide ($TiO_2$), barium titanate ($BaTiO_3$), strontium titanate ($SrTiO_3$), lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), zinc sulfide (ZnS), or the like. When an inorganic material having a high dielectric constant is included in an organic material by addition or the like, the dielectric constant of the layer 106 containing a light-emitting substance which includes the light-emitting material and the binder can be more easily controlled and can be made much higher.

When the light-emitting element 100 is of a dispersed type, the light-emitting material is dispersed in a solution including the binder in a manufacturing process of the layer 106 containing a light-emitting substance. As a solvent of the solution including the binder, a solvent which can dissolve the aforementioned binder material and which can form a solution with viscosity suitable for a desired film thickness of, and a method for forming, the layer 106 containing a light-emitting substance may be appropriately selected to be used. When, for example, a siloxane resin is used as the binder, an organic solvent such as propylene glycol monomethyl ether, propylene glycol monomethyl ether acetate (also referred to as PGMEA), or 3-methoxy-3-methyl-1-butanol (also referred to as MMB) can be used.

Subsequently, the second electrode 110 is formed over the layer 106 containing a light-emitting substance. The second electrode 110 may be formed similarly to the first electrode 102. In accordance with these steps, the light-emitting element 100 of the present invention can be completed.

The light-emitting element 120 shown in FIG. 1B can be formed by a similar manufacturing method of the light-emitting element 100. Here, description is made on the layer 126 containing a light-emitting substance, the electron supplying layer 122, and the hole supplying layer 124, which are different from those in the structure of the light-emitting element 100.

The electron supplying layer 122 is formed over the first electrode 102 which is formed over a substrate. The electron supplying layer 122 can be formed similarly to the electron supplying layer 104 of the light-emitting element 100. That is, the electron supplying layer 122 can be formed of a substance with a lower work function than that of the base material included in the layer 126 containing a light-emitting substance to be formed later, by a sputtering method, a vacuum evaporation method, a CVD method, a sol-gel method, or the like. The electron supplying layer 122 may include a substance with negative electron affinity such as diamond or aluminum nitride (AlN). The film thickness of the electron supplying layer 122 is not particularly limited; however, it is preferably in the range of 100 nm to 500 nm.

Subsequently, the layer 126 containing a light-emitting substance is formed over the electron supplying layer 122. The layer 126 containing a light-emitting substance can be formed similarly to the layer 106 containing a light-emitting substance. Since the light-emitting element 120 is of a donor-acceptor recombination light emission type, the first impurity element and the second impurity element each of which forms a donor level or an acceptor level are included in the layer 126 containing a light-emitting substance.

Next, the hole supplying layer 124 is formed over the layer 106 containing a light-emitting substance. The hole supplying layer 124 can be formed of a substance with a higher work function than that of the base material included in the layer 126 containing a light-emitting substance, by a sputtering method, a vacuum evaporation method, a CVD method, a sol-gel method, or the like. Although the film thickness is not particularly limited, it is preferably in the range of 100 nm to 500 nm.

Next, the second electrode 110 is formed over the hole supplying layer 124, thereby providing the light-emitting element 120.

Subsequently, description is made on a mechanism of carrier supply of the light-emitting element of the present invention with reference to schematic diagrams of energy bands in FIGS. 3A and 3B. Here, description is made on an example of a light-emitting element of a localized light emission type, which has an electron supplying layer 304 formed of lithium (Li) and a layer 306 containing a light-emitting substance including zinc sulfide (ZnS) as the base material and manganese (Mn) as the impurity element.

Figure 3A:
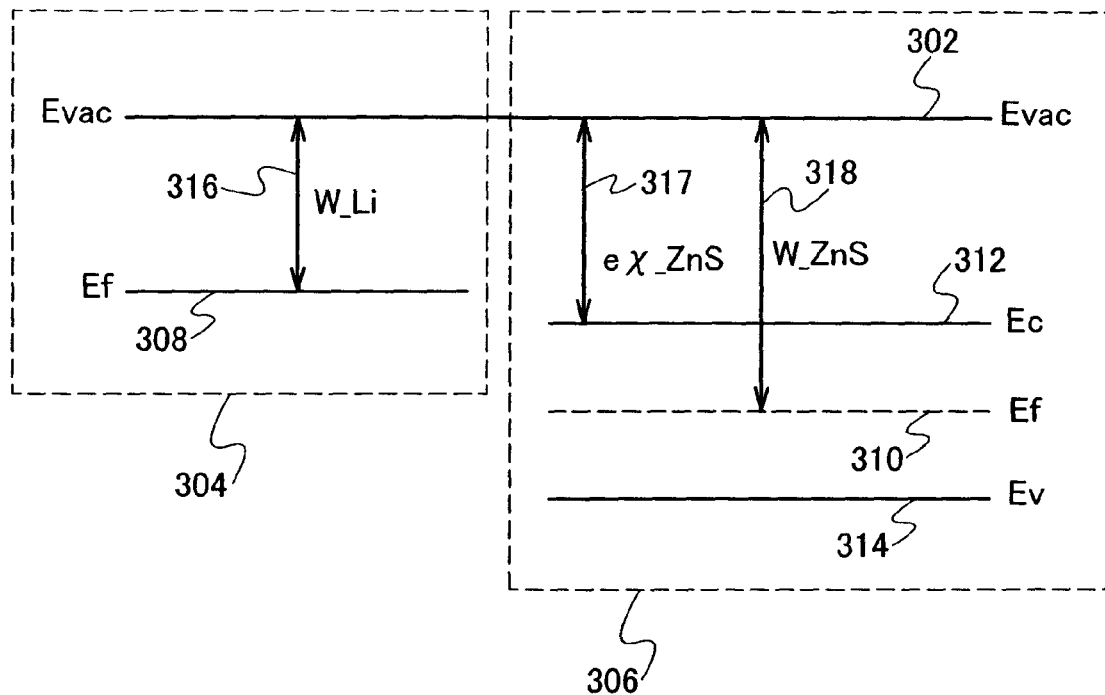
FIGS. 3A and 3B explain carrier transfer in a light-emitting element of the present invention.

FIG. 3A shows an energy band diagram in a state that the electron supplying layer 304 is not bonded with the layer 306 containing a light-emitting substance. FIG. 3A shows a vacuum level (Evac) 302, a Fermi level (Ef) 308 of the electron supplying layer 304, a Fermi level (Ef) 310 of the layer 306 containing a light-emitting substance, an energy (Ec) 312 at a lower end of a conduction band, and an energy (Ev) 314 at an upper end of a valence band.

In FIG. 3A, the Fermi level 308 of the electron supplying layer 304 is at an upper position than the Fermi level 310 of the layer 306 containing a light-emitting substance. Moreover, a potential difference from the vacuum level 302 to the Fermi level 308 of the electron supplying layer 304 corresponds to a work function (W_Li) 316 of the electron supplying layer 304. Similarly, a potential difference from the vacuum level 302 to the Fermi level (Ef) 310 of the layer 306 containing a light-emitting substance corresponds to a work function (W_ZnS) 318 of the layer 306 containing a light-emitting substance. In addition, a potential difference from the vacuum level 302 to the energy (Ec) 312 at the lower end of the conduction band of the layer 306 containing a light-emitting substance corresponds to an electron affinity (e$\chi$_ZnS) 317 of the layer 306 containing a light-emitting substance. It is to be noted that the electron affinity of the layer 306 containing a light-emitting substance in FIG. 3A is converted into energy by multiplying the electron affinity by electron charge "e." The electron affinity (here, the one multiplied by electron charge) is in proportion to a work function and matches with the work function particularly in a case of metal. Since the electron supplying layer 304 is formed of lithium in this embodiment mode, the work function 316 is 2.9 eV. Since the layer 306 containing a light-emitting substance includes zinc sulfide and manganese, the work function 318 is approximately 4.3 eV. The work function 316 of the electron supplying layer 304 is to be lower than at least the work function 318 of the layer 306 containing a light-emitting substance.

Figure 3B:
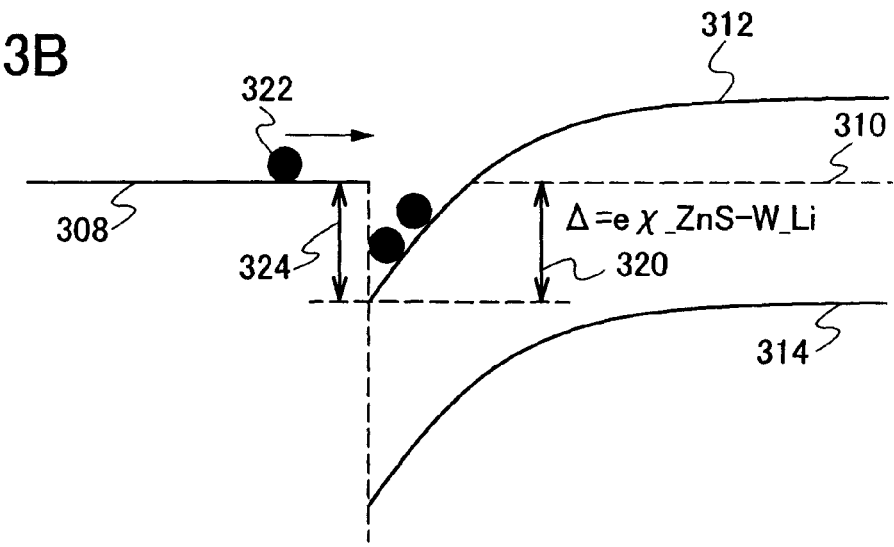

FIG. 3B shows an energy band diagram when the electron supplying layer 304 is bonded with the layer 306 containing a light-emitting substance. When the electron supplying layer 304 is bonded with the layer 306 containing a light-emitting substance, a potential 324 is generated at an interface between them. The potential 324 generated here is equal to an energy difference $\Delta 320$ ($\Delta = e\chi\_ZnS - W\_Li$), which is obtained by subtracting the work function of the electron supplying layer 304 from the electron affinity 317 of the layer 306 containing a light-emitting substance. That is to say, the energy 312 at the lower end of the conduction band of the layer 306 containing a light-emitting substance becomes lower than the Fermi level 308 of the electron supplying layer 304 by the energy difference $\Delta 320$; therefore, a carrier 322 is supplied from the electron supplying layer 304 to the layer 306 containing a light-emitting substance. Here, the carrier 322 is an electron.

In this case, when negative voltage is applied to the electron supplying layer 304 and positive voltage is applied to the layer 306 containing a light-emitting substance, carriers transfer from the electron supplying layer 304 to the layer 306 containing a light-emitting substance. Since the potential 324 is equal to the energy difference $\Delta 320$, the larger the energy difference $\Delta 320$ is, the deeper the potential 324 becomes. Thus, a larger number of carriers are supplied from the electron supplying layer 304 to the conduction band of the layer 306 containing a light-emitting substance.

The carrier 322 supplied to the layer 306 containing a light-emitting substance becomes a carrier having high energy by an electric field applied between the electron supplying layer 304 and the layer 306 containing a light-emitting substance. Then, light emission can be obtained by excitation of an inner-shell electron in a manganese atom, which is caused by collision of the carrier and a manganese atom in the layer 306 containing a light-emitting substance, and relaxation of the excited electron.

As thus described, the energy difference Δ320 may be increased in order to supply a large number of carriers to the layer 306 containing a light-emitting substance. In addition, in order to increase the energy difference Δ320, the work function 316 of the electron supplying layer 304 may be lowered. Therefore, as shown in the present invention, carriers can be efficiently supplied to the layer containing a light-emitting substance by providing the electron supplying layer including a substance with a lower work function than that of the base material included in the layer containing a light-emitting substance to be in contact with the layer containing a light-emitting substance. Accordingly, the luminous efficiency of the light-emitting element can be increased, thereby decreasing the drive voltage.

EMBODIMENT MODE 2

Figure 2A:
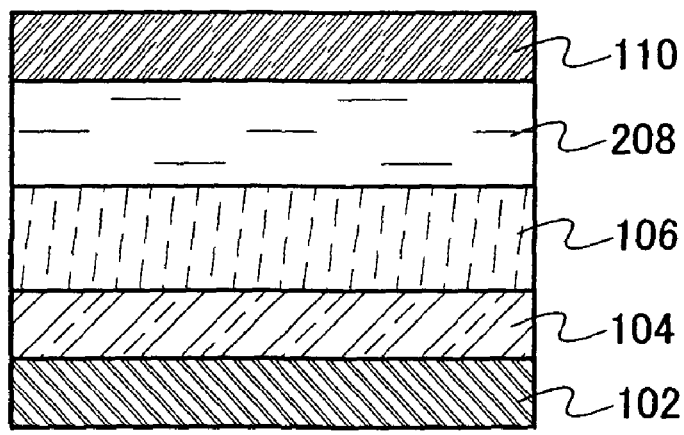
FIGS. 2A and 2B each show an example of a light-emitting element of the present invention.
Figure 2B:
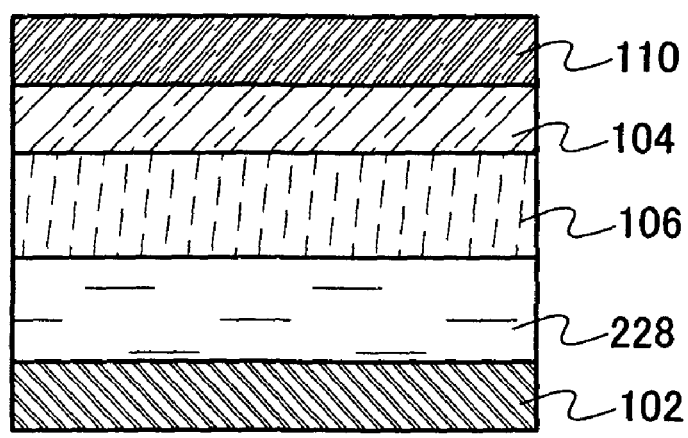

Embodiment Mode 2 will explain a light-emitting element with a different structure from that in the above embodiment mode, with reference to FIGS. 2A and 2B.

A light-emitting element 200 shown in FIG. 2A has a structure in which the first electrode 102, the electron supplying layer 104, the layer 106 containing a light-emitting substance, an insulating layer 208, and the second electrode 110 are sequentially stacked. In other words, in this structure, the layer 106 containing a light-emitting substance, the electron supplying layer 104 which is in contact with one surface of the layer 106 containing a light-emitting substance, and the insulating layer 208 which is in contact with the other surface of the layer 106 containing a light-emitting substance are interposed between the first electrode 102 and the second electrode 110.

Since the structure, the manufacturing method, and the like of the light-emitting element 200 shown in FIG. 2A except the insulating layer 208 are based on those of the light-emitting element 100 shown in Embodiment Mode 1, the description is made simply.

The insulating layer 208 used in this embodiment mode is not particularly limited; however, it is preferably formed of an insulating material with high withstand voltage, dense film quality, and a high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like; a mixed layer of these; or a stack of two or more layers of these can be used. Layers of these insulating materials can be formed by a sputtering method, an evaporation method, a CVD method, or the like. Moreover, the insulating layer may be formed by dispersing particles of these insulating materials in a binder. The binder may be formed of similar material and method to those of the binder included in the layer 106 containing a light-emitting substance described in the above embodiment mode. Thus, the insulating layer 208 can be formed over the layer 106 containing a light-emitting substance by using the above material and manufacturing method. Although the film thickness of the insulating layer 208 is not particularly limited, it is preferably in the range of 10 nm to 500 nm.

When the second electrode 110 of the light-emitting element 200 is a light-transmitting electrode and when light is extracted from the second electrode 110 side, the insulating layer 208 is preferably formed of a substance with a refractive index that is about the same as or more than that of the layer 106 containing a light-emitting substance. This is because light (emitted light) has such a property that it is reflected at an interface between stacked layers having different refractive indices. Thus, when the insulating layer 208 interposed between the second electrode 110 and the layer 106 containing a light-emitting substance is formed of a substance with a higher refractive index than that of the layer 106 containing a light-emitting substance, emitted light can be extracted without being reflected at the interface between the layer 106 containing a light-emitting substance and the insulating layer 208. In contrast, when the insulating layer 208 is formed of a substance with a lower refractive index than the layer 106 containing a light-emitting substance, emitted light is reflected at the interface between the layer 106 containing a light-emitting substance and the insulating layer 208, resulting in lower luminous efficiency. It is to be noted that many of substances used for the base material of the layer 106 containing a light-emitting substance have a refractive index of about 2. Therefore, the insulating layer 208 is preferably formed of a substance with a refractive index of 2 or more. Specifically, barium titanate ($BaTiO_3$), titanium oxide ($TiO_2$), silicon nitride (SiN), zirconium oxide ($ZrO_2$), tantalum oxide ($Ta_2O_5$), niobium oxide ($Nb_2O_5$), or the like can be used.

The layer 106 containing a light-emitting substance, the electron supplying layer 104, the first electrode 102, and the second electrode 110 are similar to those of the light-emitting element 100. Therefore, the layer 106 containing a light-emitting substance includes a light-emitting material formed of at least a base material and an impurity element. The electron supplying layer 104 is formed of a substance with a lower work function than that of the base material included in the layer 106 containing a light-emitting substance, or formed of a substance with negative electron affinity such as diamond or aluminum nitride (AlN). The first electrode 102 and the second electrode 110 are formed of various kinds of metals, alloys, or electrically conductive compounds, or a mixture thereof. When the electron supplying layer 104 is provided in contact with the first electrode 102, the first electrode 102 is preferably formed of a substance with a low work function (such as a substance with a work function of 4 eV or lower).

Subsequently, a light-emitting element 220 shown in FIG. 2B is explained. Since the structure, the manufacturing method, and the like of the light-emitting element 220 except an insulating layer 228 are based on those of the light-emitting element 100 shown in Embodiment Mode 1, the description is made simply.

Although the insulating layer 228 is not particularly limited, the insulating layer 228 is preferably formed of an insulating material with high withstand voltage, dense film quality, and moreover a high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like; a mixed layer of these; or a stack of two or more layers of these can bc used. Layers of these insulating materials can be formed by a sputtering method, an evaporation method, a CVD method, or the like. Moreover, the insulating layer may be formed by dispersing particles of these insulating materials in a binder. The binder may be formed of similar material and method to those of the binder included in the layer 106 containing a light-emitting substance described in the above embodiment mode. Thus, the insulating layer 228 can be formed over the first electrode 102 by using the above material and manufacturing method. Although the film thickness of the insulating layer 228 is not particularly limited, it is preferably in the range of 10 nm to 500 nm.

When the second electrode 110 of the light-emitting element 220 is a light-transmitting electrode and when light is extracted from the second electrode 110 side, the insulating layer 228 is preferably formed of a substance with a refractive index that is about the same as or less than that of the layer 106 containing a light-emitting substance. This is because light (emitted light) has such a property that it is reflected at an interface between stacked layers having different refractive indices, as aforementioned. Thus, when the insulating layer 228 interposed between the layer 106 containing a light-emitting substance and the first electrode 102 is formed of a substance with a lower refractive index than that of the layer 106 containing a light-emitting substance, the luminous efficiency can be improved because emitted light is reflected at the interface between the insulating layer 228 and the layer 106 containing a light-emitting substance. In contrast, when the insulating layer 228 is formed of a substance with a higher refractive index than that of the layer 106 containing a light-emitting substance, emitted light is not reflected at the interface between the insulating layer 228 and the layer 106 containing a light-emitting substance, resulting in lower luminous efficiency. It is to be noted that many of substances used for the base material of the layer 106 containing a light-emitting substance have a refractive index of about 2. Therefore, the insulating layer 228 is preferably formed of a substance with a refractive index of 2 or less. Specifically, silicon oxide ($SiO_2$), hafnium oxide ($HfO_2$), aluminum oxide ($Al_2O_3$), or the like can be used.

When the second electrode 110 of the light-emitting element 220 is a light-transmitting electrode and light is extracted from the second electrode 110 side and moreover the insulating layer 228 has a two-layer structure, an upper insulating layer in contact with the layer 106 containing a light-emitting substance is referred to as an insulating layer A whereas a lower insulating layer in contact with the first electrode 102 is referred to as an insulating layer B. In this case, the insulating layer A is formed of a substance having a refractive index that is about the same as or more than that of the layer 106 containing a light-emitting substance. The insulating layer B is formed of a substance having a refractive index that is about the same as or less than that of the upper insulating layer A. For example, when zinc sulfide (ZnS; refractive index 2.37) is used as the base material of the layer 106 containing a light-emitting substance, the lower insulating layer is formed of silicon oxide ($SiO_2$; refractive index 1.47) and the upper insulating layer is formed of barium titanate ($BaTiO_3$; refractive index 2.4). In this manner, the stacked-layer structure formed in consideration of the refractive index can increase the luminous efficiency. Moreover, since silicon oxide ($SiO_2$) and aluminum oxide ($Al_2O_3$) have a low dielectric constant, they are preferably formed in a stacked-layer structure with barium titanate ($BaTiO_3$) having a high dielectric constant.

The layer 106 containing a light-emitting substance, the electron supplying layer 104, the first electrode 102, and the second electrode 110 are similar to those of the light-emitting element 100. Thus, the layer 106 containing a light-emitting substance includes a light-emitting material formed of at least a base material and an impurity element. The electron supplying layer 104 is formed of a substance with a lower work function than that of the base material included in the layer 106 containing a light-emitting substance, or formed of a substance with negative electron affinity such as diamond or aluminum nitride (AlN). The first electrode 102 and the second electrode 110 are formed of various kinds of metals, alloys, or electrically conductive compounds, or a mixture thereof.

In the present invention, by providing the electron supplying layer in contact with the layer containing a light-emitting substance, carriers can be supplied efficiently to the layer containing a light-emitting substance. Therefore, the luminous efficiency of the light-emitting element can be improved, thereby decreasing the drive voltage.

In the light-emitting element 200 and the light-emitting element 220 shown in this embodiment mode, light emission can be obtained by voltage application between the pair of electrodes (first electrode and second electrode) sandwiching the layer 106 containing a light-emitting substance. At this time, AC voltage is applied to the two electrodes of the light-emitting element.

EMBODIMENT MODE 3

Figure 4A:
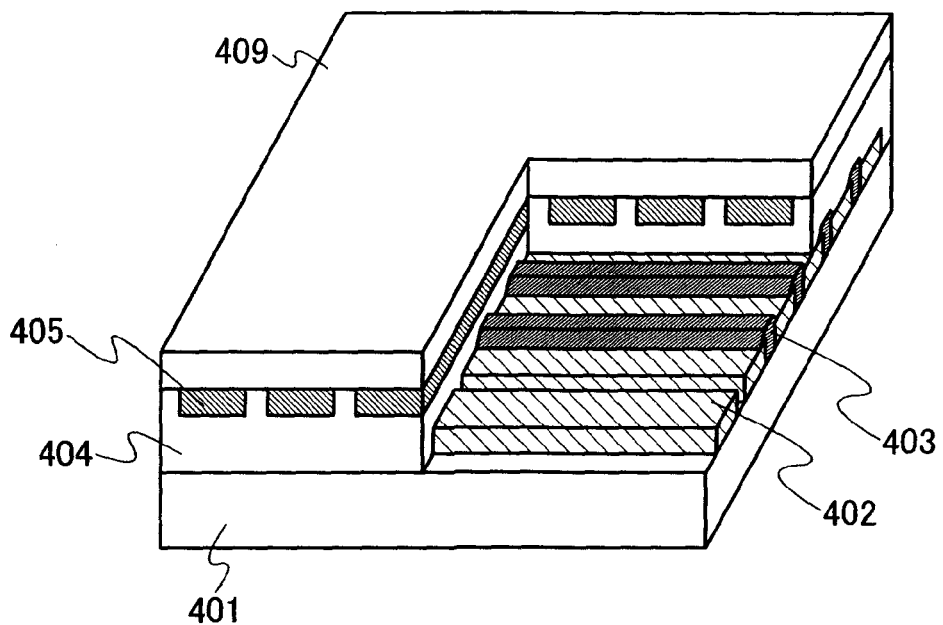
FIGS. 4A and 4B each show an example of a display device of the present invention.
Figure 4B:
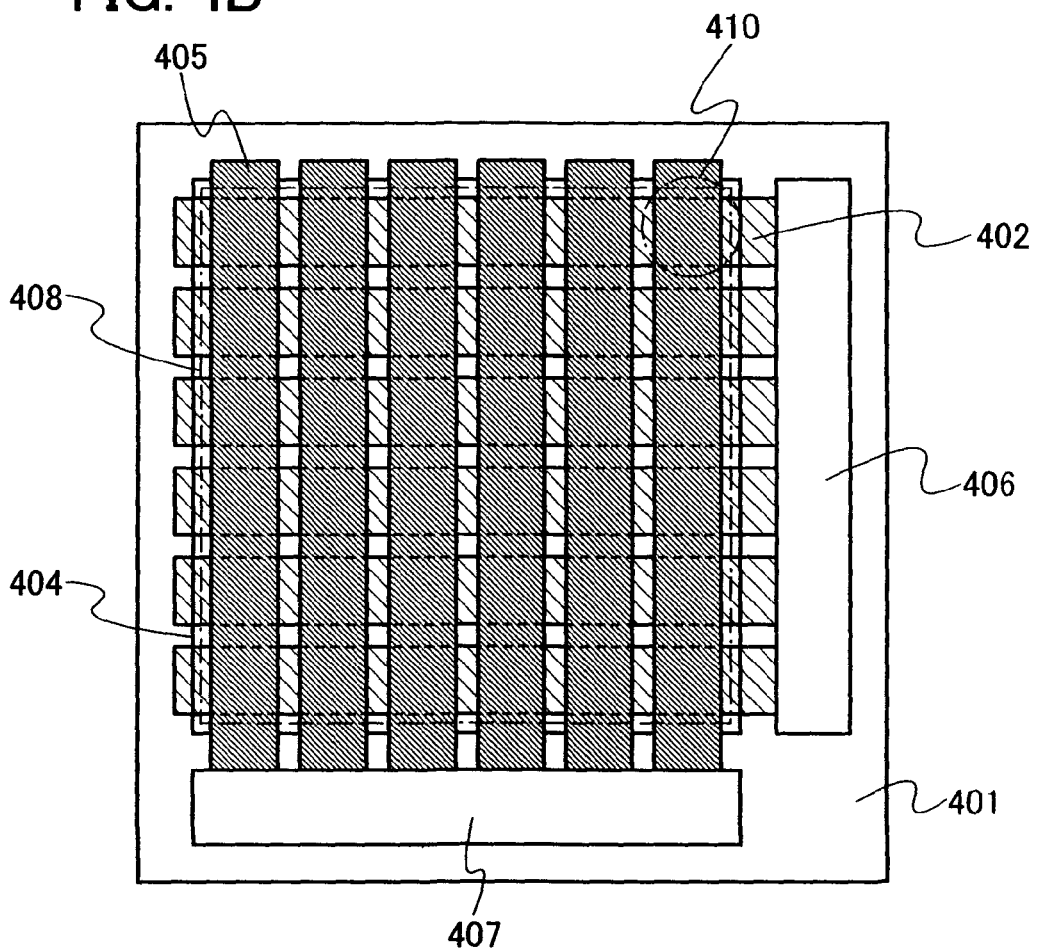

Embodiment Mode 3 will explain a display device having a light-emitting element of the present invention with reference to FIGS. 4A and 4B.

The display device shown in this embodiment mode is a passive type display device in which the light-emitting element is driven without particularly providing an element for driving such as a transistor. It is to be noted that FIG. 4A is a perspective view of a passive type display device of the present invention, and FIG. 4B is a top view thereof. Specifically, FIG. 4A is a perspective view showing a portion surrounded by a dashed line 408 in FIG. 4B.

In FIG. 4A, a plurality of first electrodes 402 are provided in parallel over a first substrate 401. End portions of each of the first electrodes 402 are covered with partition wall layers 403. In order to clarify an internal structure of the display device, a second substrate 409, second electrodes 405, and a layer 404 are partially omitted in FIG. 4A. Moreover, in order to make it easy to understand the arrangement of the first electrodes 402 and the partition wall layers 403 provided over the first substrate 401, the partition wall layers covering end portions of the first electrode 402 positioned in the front in the drawing are omitted. However, in fact, the end portions of the first electrode 402 positioned in the front are also covered with the partition wall layers.

The plurality of second electrodes 405 are provided over the first electrodes 402. The second electrodes 405 are provided in parallel so as to intersect with the first electrodes 402.

The layer 404 is provided between the first electrodes 402 and the second electrodes 405. A stacked-layer structure of the first electrodes 402, the layer 404 and the second electrodes 405 corresponds to the light-emitting element of the present invention described in the above embodiment mode. That is to say, the layer 404 includes at least the layer containing a light-emitting substance and the electron supplying layer in contact with the layer containing a light-emitting substance, which are shown in the above embodiment mode. The layer 404 may further include an insulating layer in contact with the layer containing a light-emitting substance. Moreover, the layer 404 may have the electron supplying layer in contact with one surface of the layer containing a light-emitting substance and a hole supplying layer in contact with the other surface of the layer containing a light-emitting substance. The second substrate 409 is provided over the second electrodes 405.

As shown in FIG. 4B, the first electrodes 402 are connected to a first driving circuit 406 whereas the second electrodes 405 are connected to a second driving circuit 407. In each of portions where the first electrodes 402 and the second electrodes 405 intersect with each other, a light-emitting element 410 of the present invention is formed in which at least the layer containing a light-emitting substance and the electron supplying layer in contact with the layer containing a light-emitting substance are interposed between a pair of electrodes. Then, the light-emitting element of the present invention which is selected in accordance with a signal from the first driving circuit 406 and the second driving circuit 407 emits light. The emitted light is extracted to the outside through one or both of the first electrodes 402 and the second electrodes 405. Then, light emitted from the plural light-emitting elements 410 are combined with each other to produce an image. Although FIG. 4B does not show the partition wall layers 403 and the second substrate 409 in order to clarify the arrangement of the first electrodes 402 and the second electrodes 405, they are actually provided as shown in FIG. 4A.

The first electrodes 402 and the second electrodes 405 can be formed of various kinds of metals, alloys, or electrically conductive compounds, or a mixture thereof. The materials of the first substrate 401 and the second substrate 409 are not particularly limited, and a flexible substrate using a resin such as plastic can be used as well as a glass substrate and the like. The material of the partition wall layers 403 is not particularly limited, and it may be an organic insulating material, an inorganic insulating material, a mixed material of an organic insulating material and an inorganic insulating material, or the like.

The layer 404 may be provided independently for each light-emitting element which emits light with a different color. For example, the layer 404 may be provided as an independent layer for each light-emitting element emitting red, green, or blue light. In this manner, by providing the layer 404 for each light-emitting element which emits light with a different color, a display device capable of multicolor display can be obtained.

With the electron supplying layer provided in contact with the layer containing a light-emitting substance as shown in the present invention, the light-emitting element having high luminous efficiency and operating at low drive voltage can be obtained. Therefore, the display device can be driven with lower power consumption by having the light-emitting element of the present invention.

EMBODIMENT MODE 4

Embodiment Mode 4 will explain an active matrix type display device which includes a transistor (TFT) and a light-emitting element of the present invention in each pixel of a pixel portion and in which the driving of the light-emitting element is controlled by the transistor.

Figure 5A:
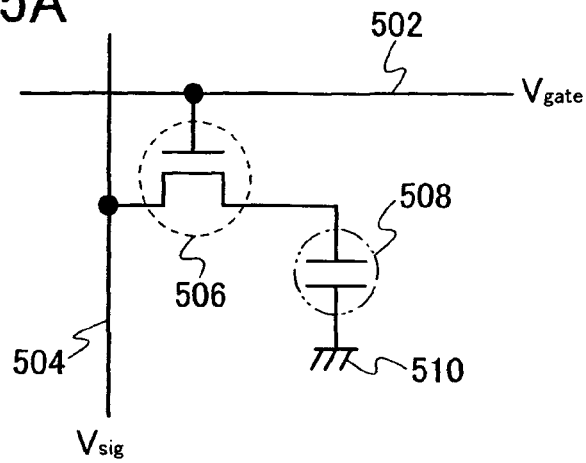
FIGS. 5A to 5C each show an example of a circuit structure of the present invention.
Figure 5B:
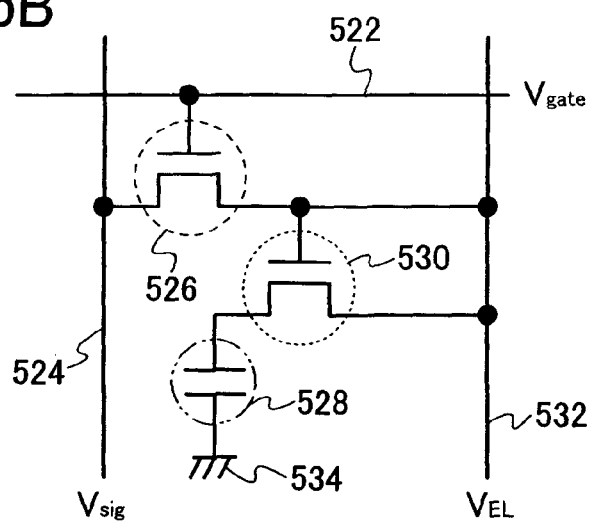
Figure 5C:
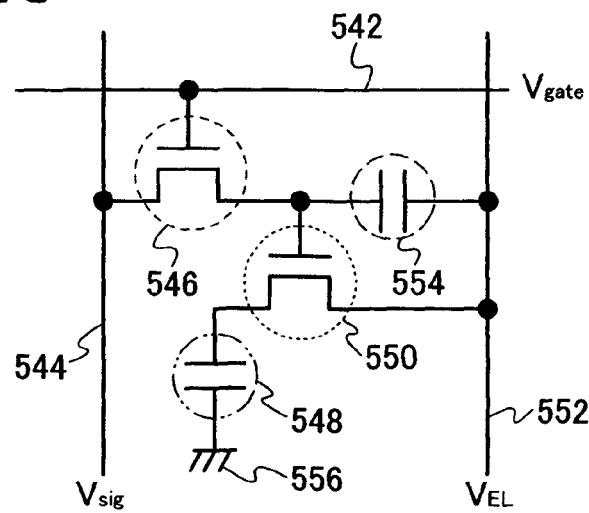

The active matrix type display device having the light-emitting element of the present invention can have a circuit structure shown in, for example, any of FIGS. 5A to 5C. Specific description will hereinafter be made.

FIG. 5A shows a structure including the following in one pixel: a light-emitting element 508 and a transistor 506 which functions as a switching element of the light-emitting element 508 (hereinafter the transistor 506 is referred to as a switching TFT 506).

A gate electrode of the switching TFT 506 is connected to a gate line 502. One of a source region and a drain region of the switching TFT 506 is connected to a data line 504 while the other is electrically connected to one electrode of the light-emitting element 508. The other electrode of the light-emitting element 508 is electrically connected to an opposing power supply 510 at which a constant voltage (reference voltage) is kept.

A signal (DC voltage $V_{gate}$) for turning on or off the switching TFT 506 is inputted through the gate line 502. Moreover, a signal for driving the light-emitting element 508 (AC or DC voltage $V_{sig}$) is inputted through the data line 504. Here, when the signal inputted to the data line 504 is AC voltage, a higher voltage than the reference voltage (a voltage having a positive polarity) and a lower voltage than the reference voltage (a voltage having a negative polarity) are alternately applied for every certain period. It is to be noted that grayscale display here can be performed by changing the amplitude of $V_{sig}$.

FIG. 5B shows a structure including the following in one pixel: a light-emitting element 528, a transistor 526 which functions as a switching element of the light-emitting element 528 (hereinafter the transistor 526 is referred to as a switching TFT 526), and a transistor 530 which functions to drive the light-emitting element 528 (hereinafter the transistor 530 is referred to as a driving TFT 530).

A gate electrode of the switching TFT 526 is connected to a gate line 522. One of a source region and a drain region of the switching TFT 526 is connected to a data line 524 while the other is electrically connected to a gate electrode of the driving TFT 530.

One of a source region and a drain region of the driving TFT 530 is connected to one electrode of the light-emitting element 528, while the other is electrically connected to a power supply line 532. The other electrode of the light-emitting element 528 is electrically connected to an opposing power supply 534 at which a constant voltage (reference voltage) is kept.

A signal (DC voltage $V_{gate}$) for turning on or off the switching TFT 526 is inputted through the gate line 522. A signal (DC voltage $V_{sig}$) for turning on or off the driving TFT 530 is inputted through the data line 524. Moreover, a signal for driving the light-emitting element 528 (AC voltage $V_{EL}$) is inputted through the power supply line 532. Here, a higher voltage than the reference voltage (a voltage having a positive polarity) and a lower voltage than the reference voltage (a voltage having a negative polarity) are alternately applied for every certain period to the power supply line 532. It is to be noted that grayscale display here can be performed by changing the amplitude of $V_{sig}$.

FIG. 5C shows a structure including the following in one pixel: a light-emitting element 548, a transistor 546 which functions as a switching element of the light-emitting element 548 (hereinafter the transistor 546 is referred to as a switching TFT 546), a transistor 550 which functions to drive the light-emitting element 548 (hereinafter, the transistor 550 is referred to as a driving TFT 550), and a storage capacitor 554 for holding a gate potential of the driving TFT 550.

A gate electrode of the switching TFT 546 is connected to a gate line 542. One of a source region and a drain region of the switching TFT 546 is connected to a data line 544 while the other is electrically connected to a gate electrode of the driving TFT 550.

One of a source region and a drain region of the driving TFT 550 is connected to one electrode of the light-emitting element 548 while the other is electrically connected to a power supply line 552. The other electrode of the light-emitting element 528 is electrically connected to an opposing power supply 556 at which a constant voltage (reference voltage) is kept.

One terminal of the storage capacitor 554 is connected to the gate electrode of the driving TFT 550 while the other terminal is connected to the power supply line 552.

A signal (DC voltage $V_{gate}$) for turning on or off the switching TFT 546 is inputted through the gate line 542. A signal (DC voltage $V_{sig}$) for turning on or off the driving TFT 550 is inputted through the data line 544. A signal (DC voltage $V_{EL}$) for driving the light-emitting element 548 is inputted through the power supply line 552. It is to be noted that grayscale display here can be performed by changing the amplitude of $V_{sig}$.

FIG. 5C is different from FIG. 5B in that the storage capacitor is provided. When DC voltage is applied to the light-emitting element 548 of the present invention through the power supply line 552 as described with reference to FIG. 5C, the storage capacitor 554 is necessary to hold a gate potential of the driving TFT 550 of the light-emitting element 548. On the other hand, when AC voltage is applied to the light-emitting element 528 of the present invention through the power supply line 532 as described with reference to FIG. 5B, and moreover the AC frequency is approximately 1 kHz, which is higher than the normal frame frequency of 60 Hz, it is not necessary to add the storage capacitor to hold the gate potential of the driving TFT 530.

Figure 6A:
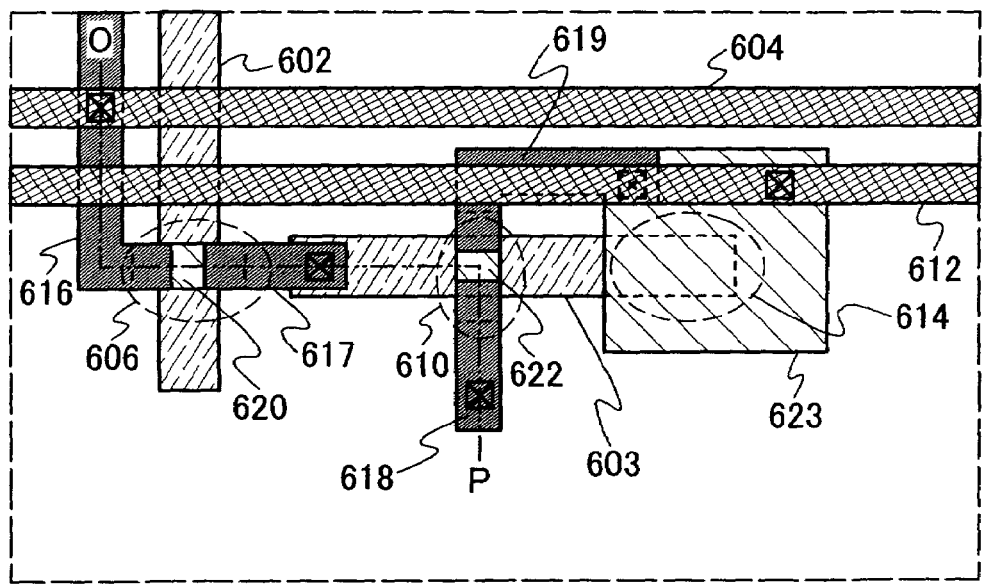
FIGS. 6A and 6B show an example of a display device of the present invention.
Figure 6B:
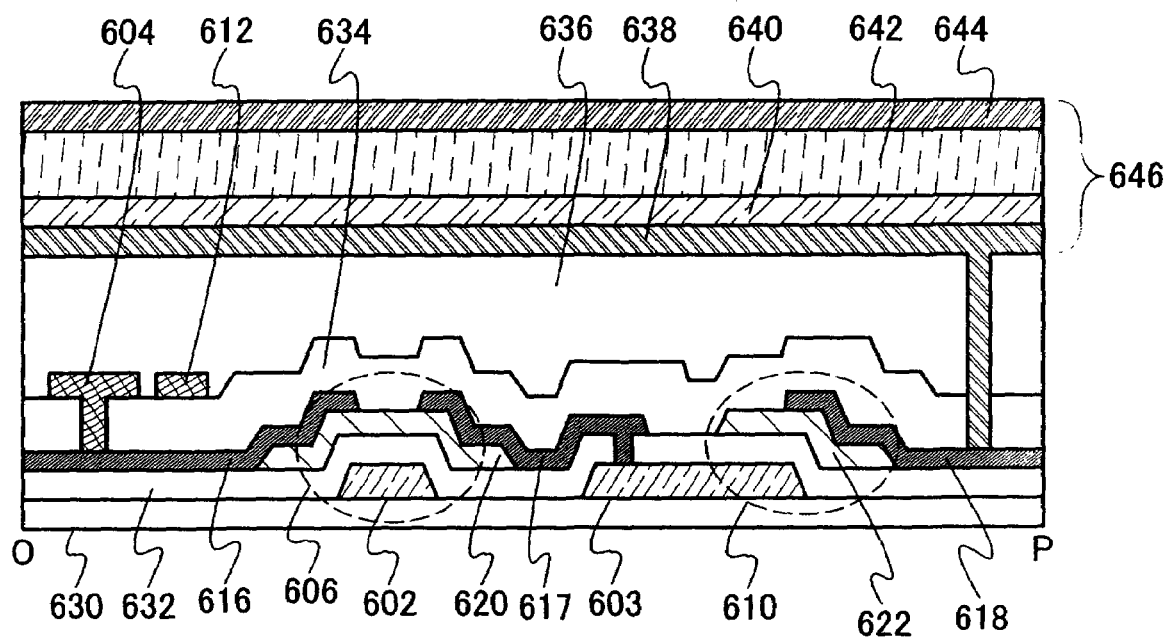

Next, a detailed structure of a pixel portion in the active matrix type display device having the circuit structure shown in FIG. 5C is explained with reference to FIGS. 6A and 6B. FIG. 6A is a top view showing a part of the pixel portion, and FIG. 6B is a cross-sectional view along a dashed line O-P in FIG. 6A.

FIG. 6A is an enlarged view of a part of the pixel portion, which shows a gate line 602, a data line 604, and a power supply line 612. Moreover, two transistors of a switching TFT 606 and a driving TFT 610, and a storage capacitor 614 are provided.

The switching TFT 606 includes a part of a semiconductor layer 620 and a part of the gate line 602. A portion of the semiconductor layer 620, which intersects with the gate line 602, will be a channel formation region of the switching TFT 606. One end of the semiconductor layer 620 is electrically connected to the data line 604 through a wiring 616 and the other end is electrically connected to a gate electrode 603 through a wiring 617.

The driving TFT 610 includes a part of a semiconductor layer 622 and a part of the gate electrode 603. A portion of the semiconductor layer 622, which intersects with the gate electrode 603, will be a channel formation region of the driving TFT 610. One end of the semiconductor layer 622 is electrically connected to a semiconductor layer 623 through a wiring 619 and the other end is electrically connected to one electrode (first electrode) of the light-emitting element through a wiring 618. The light-emitting element is omitted in FIG. 6A.

The storage capacitor 614 includes a part of the semiconductor layer 623 and a part of the gate electrode 603. One end of the semiconductor layer 623 is electrically connected to the semiconductor layer 622 through the wiring 619 as described above, and the other end is electrically connected to the power supply line 612.

Subsequently, a cross-sectional structure shown in FIG. 6B is explained. The pixel portion is provided with the switching TFT 606, the driving TFT 610, and a light-emitting element 646 over a substrate 630. Although the pixel portion is provided with the storage capacitor 614 shown in FIG. 6A, the storage capacitor 614 is not shown here.

The light-emitting element 646 is the light-emitting element of the present invention described in the above embodiment mode, and includes at least the layer containing a light-emitting substance and the electron supplying layer which is in contact with the layer containing a light-emitting substance. The light-emitting element 646 may further include an insulating layer in contact with the layer containing a light-emitting substance. In addition, the light-emitting element 646 may include the electron supplying layer in contact with one surface of the layer containing a light-emitting substance and a hole supplying layer in contact with the other surface of the layer containing a light-emitting substance. In this embodiment mode, the light-emitting element 646 has a structure in which a first electrode 638, an electron supplying layer 640, a layer 642 containing a light-emitting substance, and a second electrode 644 are sequentially stacked. The first electrode 638 is electrically connected to the driving TFT 610 through the wiring 618.

The data line 604 and the power supply line 612 are provided over a first insulating layer 634. One end of the semiconductor layer 620 is electrically connected to the gate electrode 603 through the wiring 617. The other end of the semiconductor layer 620 is electrically connected to the data line 604 through the wiring 616.

The structure of the light-emitting element 646 is based on the above embodiment mode. That is to say, the first electrode 638 and the second electrode 644 can be formed of various kinds of metals, alloys, or electrically conductive compounds, or a mixture thereof. Thus, the layer 642 containing a light-emitting substance includes a light-emitting material formed of at least a base material and an impurity element. The electron supplying layer 640 is formed of a substance with a lower work function than that of the base material included in the layer 642 containing a light-emitting substance, or formed of a substance with negative electron affinity such as diamond or aluminum nitride (AlN). In the case of providing the insulating layer, an inorganic insulating material, an organic insulating material, a mixed material of an inorganic insulating material and an organic insulating material, or the like is used. In addition, in the case of providing the electron supplying layer in contact with one surface of the layer containing a light-emitting substance and the hole supplying layer in contact with the other surface of the layer containing a light-emitting substance. The hole supplying layer is formed of a substance with a higher work function than that of the base material included in the layer containing a light-emitting substance.

The substrate 630 may be a glass substrate, a quartz substrate, or a stainless steel substrate with an insulating layer formed on one surface thereof. Besides those, a substrate made of plastic having heat resistance that can withstand process temperature in later steps (such as polyimide, acrylic, polyethylene terephthalate, polycarbonate, polyacrylate, or polyether sulfone), or the like can also be used. These substrates may be used after being polished by CMP or the like, as required.

Materials of the gate line 602 and the gate electrode 603 are not particularly limited, and various kinds of conductive materials can be applied. For example, a single-layer structure including one or more selected from tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and the like, and an alloy or compound material containing any of these elements as its main component, or a stacked-layer structure thereof can be used. In addition, a semiconductor material typified by polycrystalline silicon doped with an impurity element such as phosphorus can be used.

Materials of the wirings 616, 617, and 618, the data line 604, and the power supply line 612 are not particularly limited, and various kinds of conductive materials can be used. However, the materials thereof are preferably low resistant because they function as wirings. For example, a single-layer structure including one or more selected from silver (Ag), gold (Au), copper (Cu), nickel (Ni), platinum (Pt), palladium (Pd), iridium (Ir), rhodium (Rh), tungsten (W), aluminum (Al), tantalum (Ta), molybdenum (Mo), cadmium (Cd), zinc (Zn), iron (Fe) titanium (Ti), zirconium (Zr), barium (Ba), and the like, and an alloy or compound material containing any of these elements as its main component, or a stacked-layer structure thereof can be used. Moreover, an alloy or compound material containing silicon (Si) or germanium (Ge) as its main component can be used. Needless to say, the aforementioned low-resistant material and a material containing silicon or germanium as its main component can be stacked to be used.

A gate insulating layer 632 may be a single layer or stacked layers including an insulating material such as silicon oxide, silicon nitride, or silicon including oxygen and nitrogen.

The semiconductor layer 620 and the semiconductor layer 622 can use an inorganic semiconductor material containing silicon (Si), silicon-germanium (SiGe), gallium-arsenic (GaAs), zinc oxide (ZnO), or the like as its main component. Besides those, an organic semiconductor material containing pentacene, oligothiophene, or the like as its main component can also be used.

The first insulating layer 634 and a second insulating layer 636 can use an organic insulating material, an inorganic insulating material, or a mixed material of an organic insulating material and an inorganic insulating material. The inorganic insulating material may be silicon oxide, silicon nitride, or the like. The organic insulating material may be polyimide, acrylic, polyamide, polyimideamide, benzocyclobutene, siloxane, polysilazane, or the like. It is to be noted that a siloxane resin corresponds to a resin including a Si—O—Si bond. Siloxane has its skeletal structure formed by a bond of silicon (Si) and oxygen (O). An organic group containing at least hydrogen (such as an alkyl group or aromatic hydrocarbon) is used for a substituent. A fluoro group may be used for the substituent. Further, an organic group containing at least hydrogen and a fluoro group may be used for the substituent. Polysilazane is formed by using a polymer material including a bond of silicon (Si) and nitrogen (N) as a starting material.

As shown in this embodiment mode, the power consumption of the display device can be reduced by having the light-emitting element of the present invention in which the electron supplying layer is provided in contact with the layer containing a light-emitting substance. Moreover, because of having the light-emitting element with favorable luminous efficiency, the display device with high image quality can be obtained.

EMBODIMENT MODE 5

Embodiment Mode 5 will explain a manufacturing method of the active matrix type display device shown in FIG. 6B, with reference to FIGS. 7A to 8C.

Figure 7A:
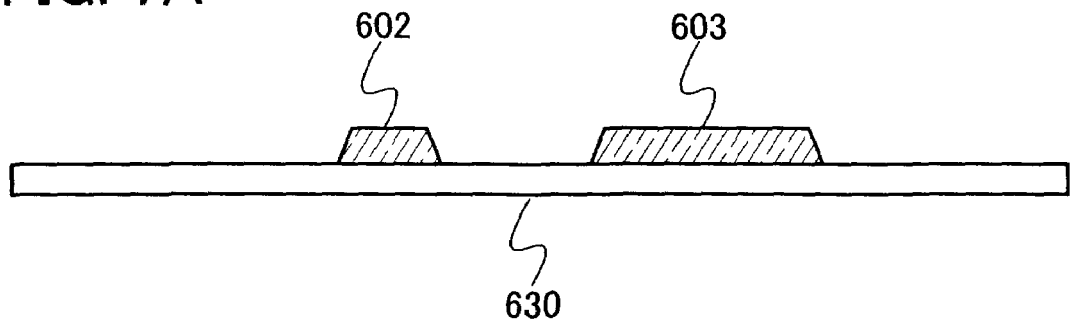
FIGS. 7A to 7D show an example of a manufacturing method of a display device of the present invention.

A first conductive layer is formed over the substrate 630 by a sputtering method, a PVD method, a CVD method, a droplet discharging method, an inkjet method, a printing method, or the like. The first conductive layer preferably has a thickness of 100 nm to 500 nm. Here, the first conductive layer is formed by a tungsten layer of 150 nm thick over the glass substrate 630 by a sputtering method. Subsequently, the first conductive layer is processed by a photolithography method and an etching method, thereby forming the gate line 602 and the gate electrode 603 (FIG. 7A). A part of the gate line 602 formed here functions as a gate electrode of the switching TFT 606. A part of the gate electrode 603 functions as a gate electrode of the driving TFT 610.

Figure 7B:
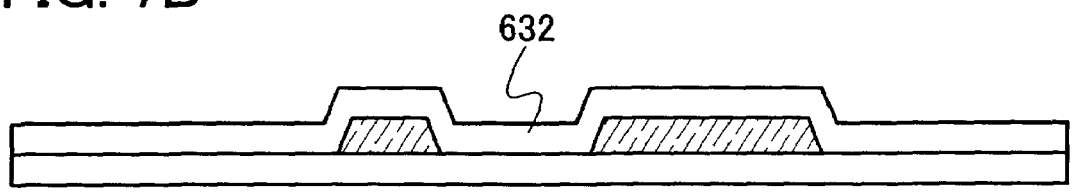

Subsequently, the gate insulating layer 632 is formed over the gate line 602 and the gate electrode 603 by a sputtering method, a CVD method, or the like. The gate insulating layer 632 preferably has a thickness of 10 nm to 500 nm. Here, the gate insulating layer 632 is formed by a silicon oxide layer ($SiO_2$) of 100 nm thick (FIG. 7B).

Figure 7C:
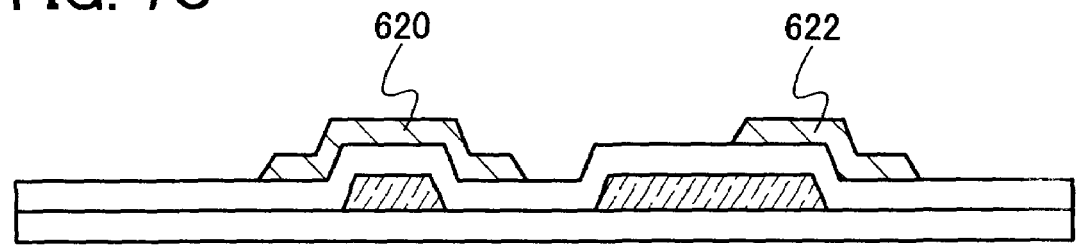

Subsequently, a semiconductor layer is formed over the gate insulating layer 632 by a sputtering method, a CVD method, or the like. The semiconductor layer preferably has a thickness of 100 nm to 1000 nm. Here, the semiconductor layer is formed by a zinc oxide (ZnO) layer of 100 nm thick by a sputtering method. Then, the semiconductor layer is processed by a photolithography method and an etching method, thereby forming the semiconductor layer 620 and the semiconductor layer 622 (FIG. 7C).

Figure 7D:
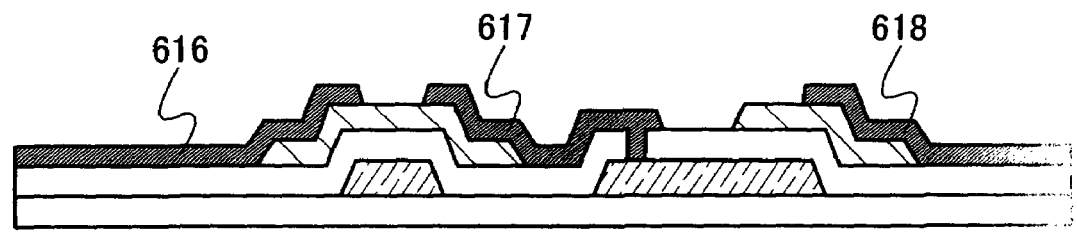

Subsequently, a contact hole reaching the gate electrode 603 is formed in the gate insulating layer 632 by a photolithography method and an etching method. Then, a second conductive layer is formed over the semiconductor layers 620 and 622 by a sputtering method, a PVD method, a CVD method, a droplet discharging method, an inkjet method, a printing method, or the like. The second conductive layer preferably has a thickness of 100 nm to 500 nm. Here, the second conductive layer is formed by an aluminum-titanium alloy film of 200 nm thick by a sputtering method. Then, the second conductive layer is processed by a photolithography method and an etching method, thereby forming the wirings 616, 617, and 618 (FIG. 7D). At this time, the semiconductor layer 620 is electrically connected to the gate electrode 603 through the wiring 617.

Next, the first insulating layer 634 is formed over the wirings 616, 617, and 618 by a sputtering method, a CVD method, a coating method, or the like. The first insulating layer 634 preferably has a thickness of 10 nm to 500 nm. Here, the first insulating layer 634 is formed by a silicon oxide layer of 500 nm thick by a sputtering method.

Figure 8A:
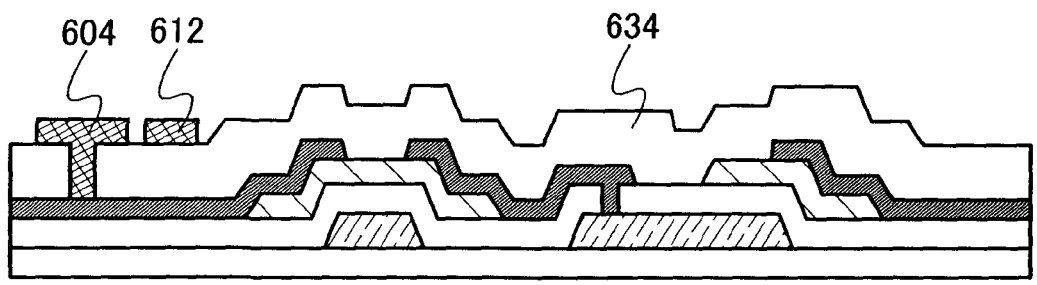
FIGS. 8A to 8C show an example of a manufacturing method of a display device of the present invention.

Subsequently, a contact hole reaching the wiring 616 is formed in the first insulating layer 634 by a photolithography method and an etching method. Then, a third conductive layer is formed over the first insulating layer 634 by a sputtering method, a PVD method, a CVD method, a droplet discharging method, an inkjet method, a printing method, or the like. The third conductive layer preferably has a thickness of 100 nm to 500 nm. Here, the third conductive layer is formed by an aluminum-titanium alloy layer of 200 nm thick by a sputtering method. Then, the third conductive layer is processed by a photolithography method and an etching method, thereby forming the data line 604 and the power supply line 612 (FIG. 8A). At this time, the data line 604 is electrically connected to the semiconductor layer 620 through the wiring 616.

Figure 8B:
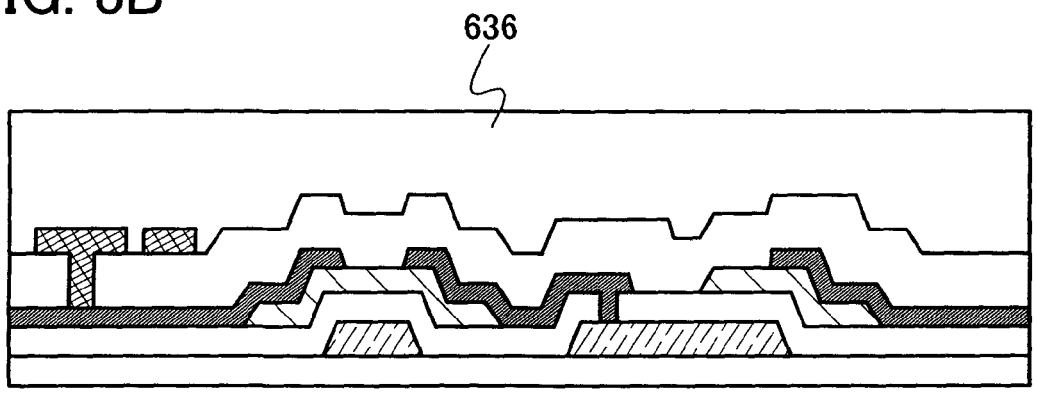

Next, the second insulating layer 636 is formed over the data line 604, the power supply line 612, and the first insulating layer 634 by a sputtering method, a CVD method, a coating method, or the like. The second insulating layer 636 preferably has a thickness of 500 nm to 1500 nm so as to be flattened. Here, the second insulating layer 636 is formed by a silicon oxide layer of 1000 nm thick by a sputtering method (FIG. 8B).

Subsequently, a contact hole reaching the wiring 618 is formed in the second insulating layer 636 and the first insulating layer 634 by a photolithography method and an etching method. Then, the first electrode 638 is formed over the second insulating layer 636 by a sputtering method, a vacuum evaporation method, a CVD method, a sol-gel method, or the like. The first electrode 638 preferably has a thickness of 100 nm to 500 nm. Here, the first electrode 638 is formed of aluminum in 200 nm thick by a sputtering method. At this time, the first electrode 638 is electrically connected to the semiconductor layer 622 through the wiring 618.

Next, the electron supplying layer 640 is formed over the first electrode 638 by a sputtering method, a vacuum evaporation method, a CVD method, a sol-gel method, or the like. The electron supplying layer 640 preferably has a thickness of 10 nm to 500 nm. Here, the electron supplying layer 640 is formed of lithium in 200 nm thick by a vacuum evaporation method.

Subsequently, the layer 642 containing a light-emitting substance is formed over the electron supplying layer 640. If the light-emitting element to be formed here is of a thin film type, the layer 642 containing a light-emitting substance is formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like. Meanwhile, if the light-emitting element to be formed here is of a dispersed type, the layer 642 containing a light-emitting substance is formed by a droplet discharging method, a printing method (such as screen printing or offset printing), a coating method such as a spin coating method, a dipping method, a dispenser method, or the like. The layer 642 containing a light-emitting substance preferably has a thickness of 100 nm to 1000 nm. Here, the layer 642 containing a light-emitting substance is formed of zinc sulfide (ZnS) including 0.5 wt % of manganese in 200 nm thick by a sputtering method. At this time, an impurity element to be included may be changed so that the layer containing a light-emitting substance which emits light with a different color is formed independently by using a metal mask or the like. When the layers containing a light-emitting substance which emit light with different colors are formed separately, a display device capable of multicolor display can be provided.

Figure 8C:
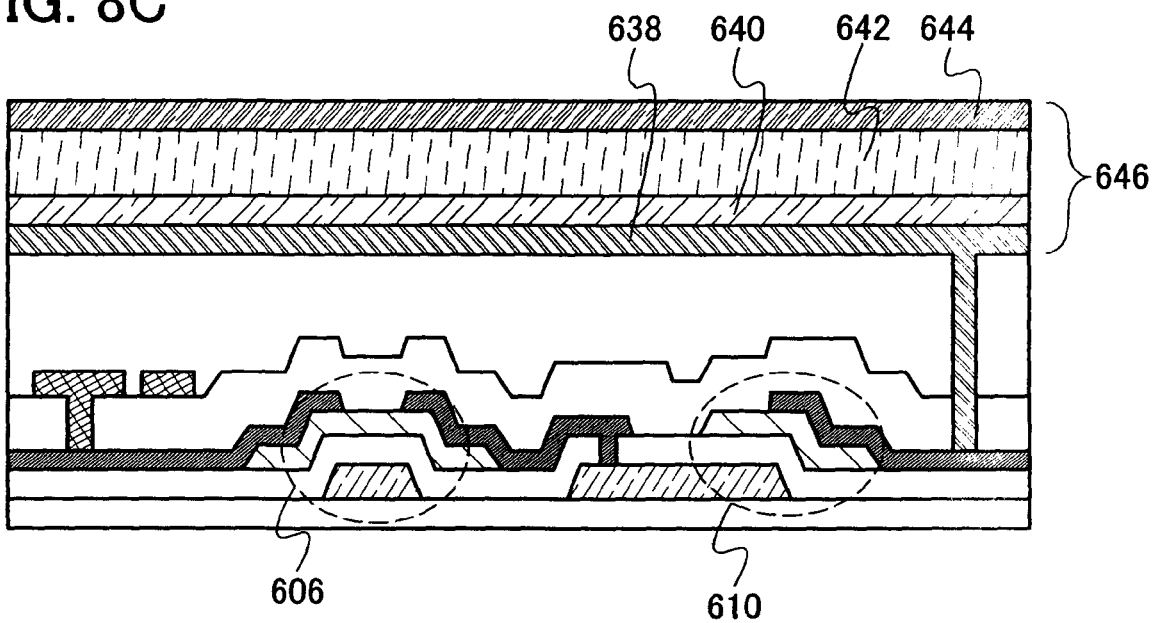

Next, the second electrode 644 is formed over the layer 642 containing a light-emitting substance. The second electrode 644 may be formed similar to the first electrode 638. Here, the second electrode 644 is formed of indium tin oxide in 50 nm thick by a sputtering method (FIG. 8C).

In accordance with above steps, the display device including the light-emitting element 646, the switching TFT 606, and the driving TFT 610 can be provided.

As shown in this embodiment mode, the power consumption of the display device can be reduced by having the light-emitting element of the present invention in which the electron supplying layer is provided in contact with the layer containing a light-emitting substance.

EMBODIMENT MODE 6

Embodiment Mode 6 will explain an active matrix type display device having a light-emitting element of the present invention in a pixel portion, with reference to FIGS. 9A and 9B. In addition to a light-emitting element of the present invention, a display device in the present invention includes a controller such as a driving circuit for driving the light-emitting element. FIG. 9A is a schematic view showing a top surface of the display device, and FIG. 9B is a cross-sectional view along a dashed line Q-R in FIG. 9A.

A display device 900 described in this embodiment mode includes, over a substrate 901, a pixel portion 902 and a driving circuit portion 904 for driving the pixel portion 902. A sealing substrate 908 is provided over the substrate 901 with a sealant 910 interposed therebetween. Moreover, a terminal portion 906 is provided over the substrate 901. Signals and power supply potentials for controlling operations of plural elements included in the pixel portion 902 are inputted from the outside through the terminal portion 906.

The pixel portion 902 is provided with a light-emitting element 930 of the present invention, a driving TFT 924, a switching TFT 922, and a storage capacitor 920. The light-emitting element 930 of this embodiment mode has a structure in which a first electrode 932, an electron supplying layer 934, a layer 936 containing a light-emitting substance, and a second electrode 938 are sequentially stacked. The light-emitting element 930 is based on the above embodiment mode, and includes at least the layer containing a light-emitting substance and the electron supplying layer which is in contact with the layer containing a light-emitting substance. Therefore, the light-emitting element 930 may have an insulating layer in contact with the layer containing a light-emitting substance, or may have the electron supplying layer which is in contact with one surface of the layer containing a light-emitting substance and a hole supplying layer which is in contact with the other surface of the layer containing a light-emitting substance. The first electrode 932 of the light-emitting element 930 is electrically connected to the driving TFT 924 through a contact hole provided in a first insulating layer 914 and a second insulating layer 916. Moreover, the driving TFT 924, the switching TFT 922, and the storage capacitor 920 are also based on the above embodiment mode.

End portions of the first electrode 932 of the light-emitting element 930 are covered with a partition wall layer 918. The partition wall layer 918 is formed of an inorganic insulating material such as silicon oxide or silicon nitride; an organic insulating material such as acrylic or polyimide; siloxane; or the like. The partition wall layer 918 can separate light-emitting elements provided adjacent to each other. When the partition wall layer 918 has an edge with a rounded shape as shown in this embodiment mode, the light-emitting layer can be covered sufficiently when being formed; therefore, defects or deterioration in characteristics of the light-emitting element can be reduced.

The driving circuit portion 904 is provided with plural transistors 926, which form a driving circuit for controlling the operation of the pixel portion 902. The driving circuit portion 904 for controlling the operation of the pixel portion 902 is provided with, for example, a shift register, a decoder, a buffer, a sampling circuit, a latch, and the like.

The substrate 901 and the sealing substrate 908 are attached to each other with the sealant 910 interposed therebetween so as to enclose the pixel portion 902 and the driving circuit portion 904. The sealing substrate 908 is provided with a color filter 942 and a light-shielding layer 944. The present invention is not limited in particular, and the color filter 942 or the light-shielding layer 944 may be omitted. The substrate 901 and the sealing substrate 908 are not particularly limited, and each of which may be a glass substrate, a plastic substrate (made of polyimide, acrylic, polyethylene terephthalate, polycarbonate, polyarylate, polyether sulfone, or the like), or the like.

Moreover, an internal portion 948 sealed by the substrate 901 and the sealing substrate 908 may be filled with an inert gas such as nitrogen or argon, a resin material, or the like. The resin material used for the filling may include a drying agent Since an inorganic light-emitting element including the present invention does not easily deteriorate due to moisture, it is not always necessary to seal the light-emitting element from above.

At the terminal portion 906, a flexible printed circuit (FPC) 954 is connected to a wiring 950 by using a conductive adhesive 952 or the like.

As shown in this embodiment mode, the power consumption of the display device can be reduced by having the light-emitting element of the present invention in which the electron supplying layer is provided in contact with the layer containing a light-emitting substance.

EMBODIMENT MODE 7

Embodiment Mode 7 will explain electronic appliances of the present invention each including any of the display devices shown in Embodiment Modes 3 to 6 as a component.

The electronic appliances manufactured using the light-emitting element of the present invention include a camera such as a video camera or a digital camera, a goggle type display, a navigation system, a sound reproduction device (such as a car audio or an audio component), a computer, a game appliance, a mobile information terminal (such as a mobile computer, a mobile phone, a mobile game machine, or an electronic book), an image reproduction device provided with a recording medium (specifically, a device which reproduces a recording medium such as a digital versatile disk (DVD) and which is provided with a display device for displaying the image), and the like. Specific examples of these electronic appliances are shown in FIGS. 10A to 10D.

Figure 10A:
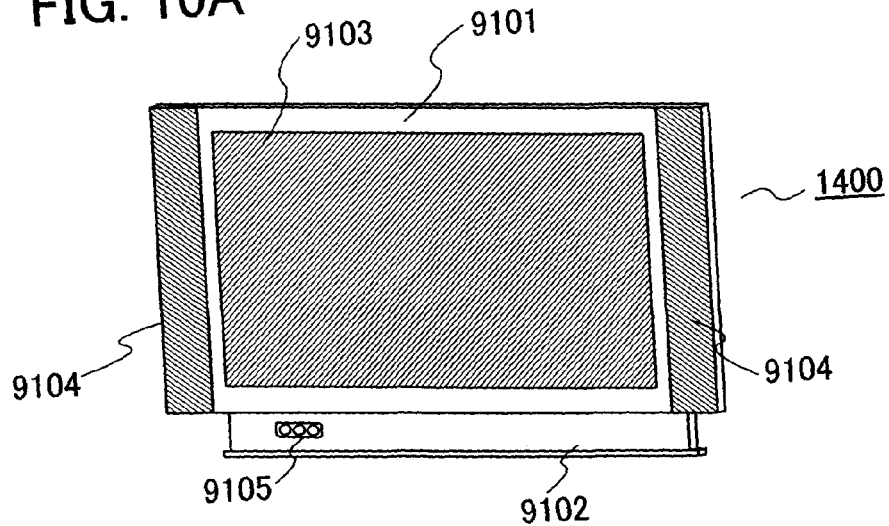
FIGS. 10A to 10D each show an example of an electronic appliance of the present invention.

FIG. 10A shows a television device 1400 of the present invention, which includes a housing 9101, a support base 9102, a display portion 9103, a speaker portion 9104, a video input terminal 9105, and the like. In the display portion 9103 of this television device, light-emitting elements similar to those described in Embodiment Mode 1 or 2 are arranged in matrix. The light-emitting element has features of high luminous efficiency and low drive voltage. The display portion 9103 including such light-emitting elements also has similar features. Accordingly, since this television device consumes less electric power, a product suitable for a dwelling environment can be provided.

Figure 10B:
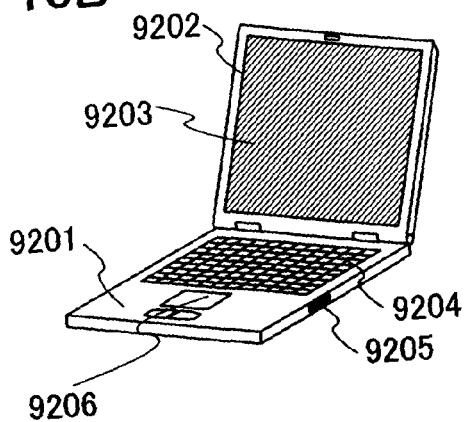

FIG. 10B shows a computer of the present invention, which includes a main body 9201, a housing 9202, a display portion 9203, a keyboard 9204, an external connection port 9205, a pointing mouse 9206, and the like. In the display portion 9203 of this computer, light-emitting elements similar to those described in Embodiment Mode 1 or 2 are arranged in matrix. The light-emitting element has features of high luminous efficiency and low drive voltage. The display portion 9203 including such light-emitting elements also has similar features. Accordingly, since this computer consumes less electric power, a product suitable for an environment can be provided.

Figure 10C:
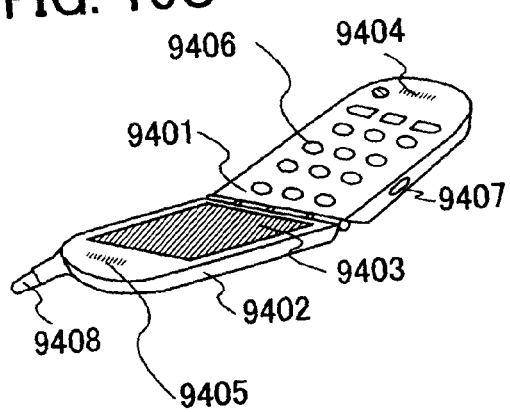

FIG. 10C shows a mobile phone of the present invention, which includes a main body 9401, a housing 9402, a display portion 9403, an audio input portion 9404, an audio output portion 9405, an operation key 9406, an external connection port 9407, an antenna 9408, and the like. In the display portion 9403 of this mobile phone, light-emitting elements similar to those described in Embodiment Mode 1 or 2 are arranged in matrix. The light-emitting element has features of high luminous efficiency and low drive voltage. The display portion 9403 including such light-emitting elements also has similar features. Accordingly, since this mobile phone consumes less electric power, a product suitable for being carried can be provided.

Figure 10D:
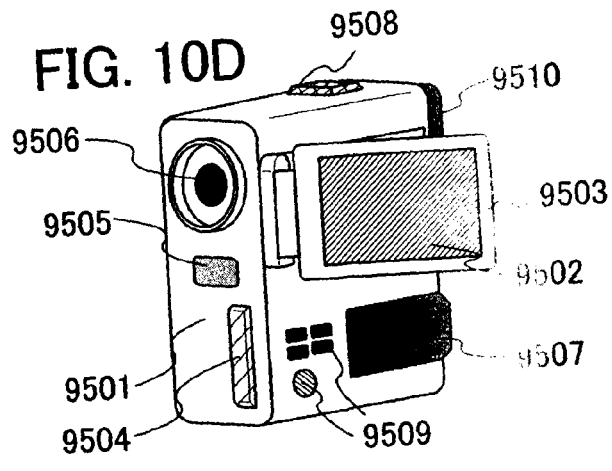

FIG. 10D shows a camera of the present invention, which includes a main body 9501, a display portion 9502, a housing 9503, an external connection port 9504, a remote control receiving portion 9505, an image receiving portion 9506, a battery 9507, an audio input portion 9508, an operation key 9509, an eyepiece portion 9510, and the like. In the display portion 9502 of this camera, light-emitting elements similar to those described in Embodiment Mode 1 or 2 are arranged in matrix. The light-emitting element has features of high luminous efficiency and low drive voltage. The display portion 9502 including such light-emitting elements also has similar features. Accordingly, since this camera consumes less electric power, a product suitable for being carried can be provided.

As thus described, the application range of the display device of the present invention is quite wide, and this display device can be applied to electronic appliances of every field. By using the display device of the present invention, the electronic appliance consuming less electric power can be provided.

Moreover, since the display device of the present invention has the light-emitting element with high luminous efficiency, the display device can also be used as an illumination apparatus. A mode of using the light-emitting element of the present invention for an illumination apparatus is explained with reference to FIG. 11.

Figure 11:
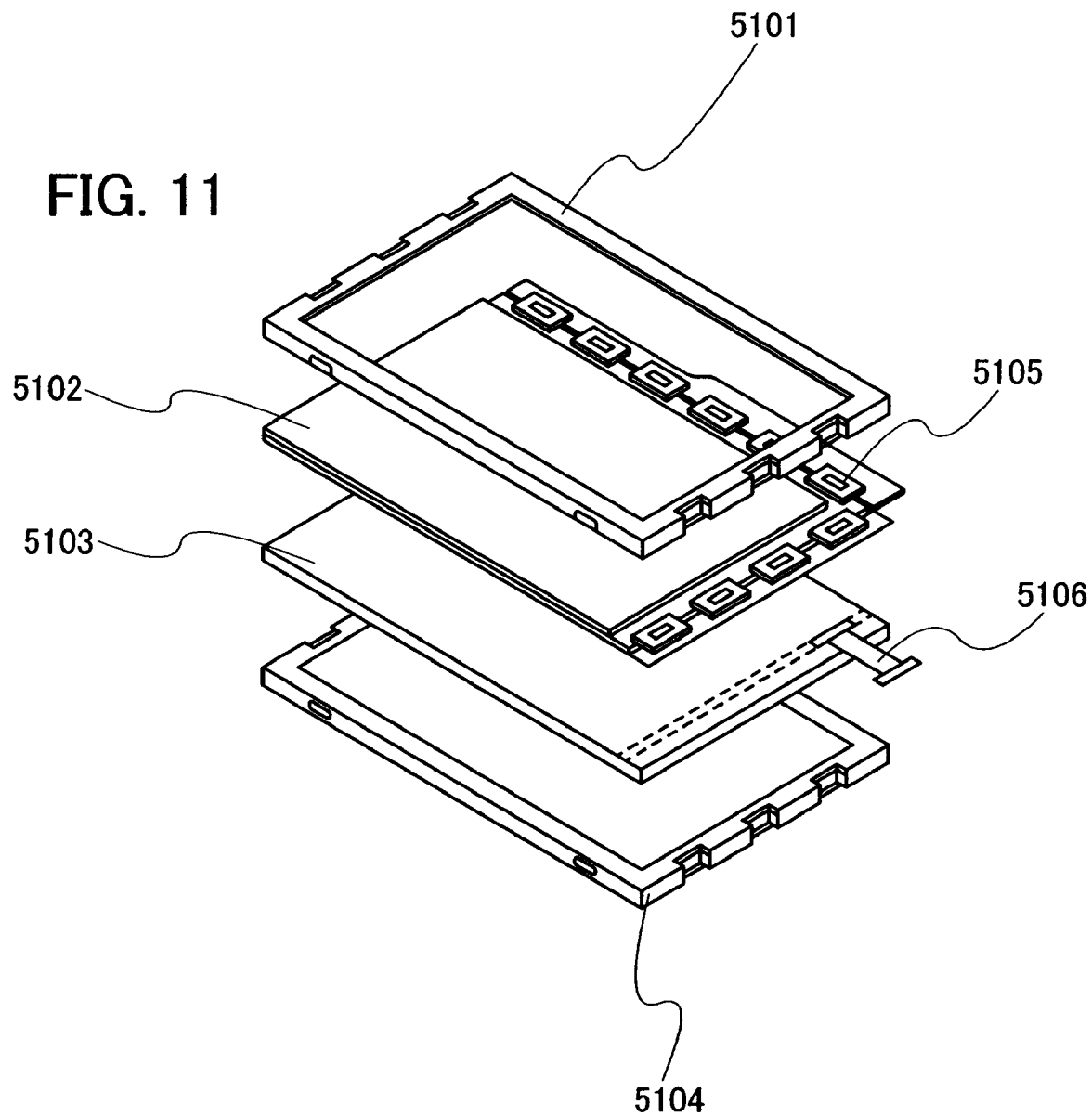
FIG. 11 shows an example of an electronic appliance of the present invention.

FIG. 11 shows an example of a liquid crystal display device using the display device of the present invention as a backlight. The liquid crystal display device shown in FIG. 11 includes a housing 5101, a liquid crystal layer 5102, a backlight 5103, and a housing 5104. The liquid crystal layer 5102 is connected to a driver IC 5105. The backlight 5103 uses the display device of the present invention, to which current is supplied through a terminal 5106.

By using the display device of the present invention as the backlight of the liquid crystal display device, the backlight with reduced power consumption can be obtained. Since the display device of the present invention can be used as an illumination apparatus of surface light emission and can be enlarged, the backlight can be enlarged, resulting in that the liquid crystal display device can be enlarged. Moreover, since the display device of the present invention is thin and consumer less electric power, the thickness and power consumption of the liquid crystal display device can also be reduced.

Figure 12:
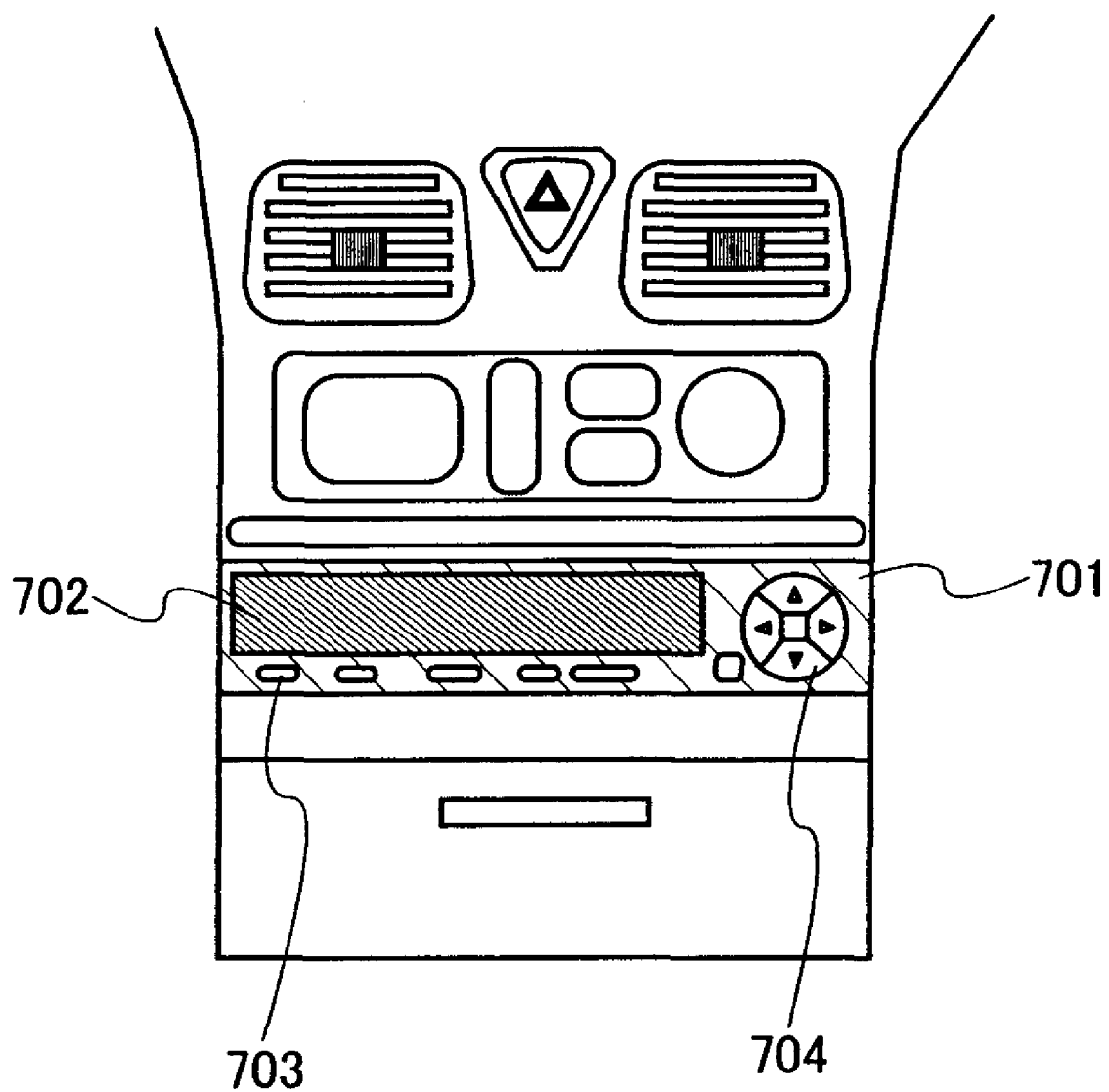
FIG. 12 shows an example of an electronic appliance of the present invention.

FIG. 12 shows a car audio as a specific example of a sound reproduction device, which includes a main body 701, a display portion 702, an operation switch 703, and an operation switch 704. The display portion 702 can be formed by using the display device (passive type) shown in Embodiment Mode 3 or the display device (active type) shown in any of Embodiment Modes 4 to 6. This display portion 702 may be formed by a display device of a segment type. In either case, the display portion with reduced power consumption can be formed by using the light-emitting element of the present invention. Although this embodiment mode shows an audio device for a car, the present invention can be applied to a mobile or home-use audio device.

Figure 13:
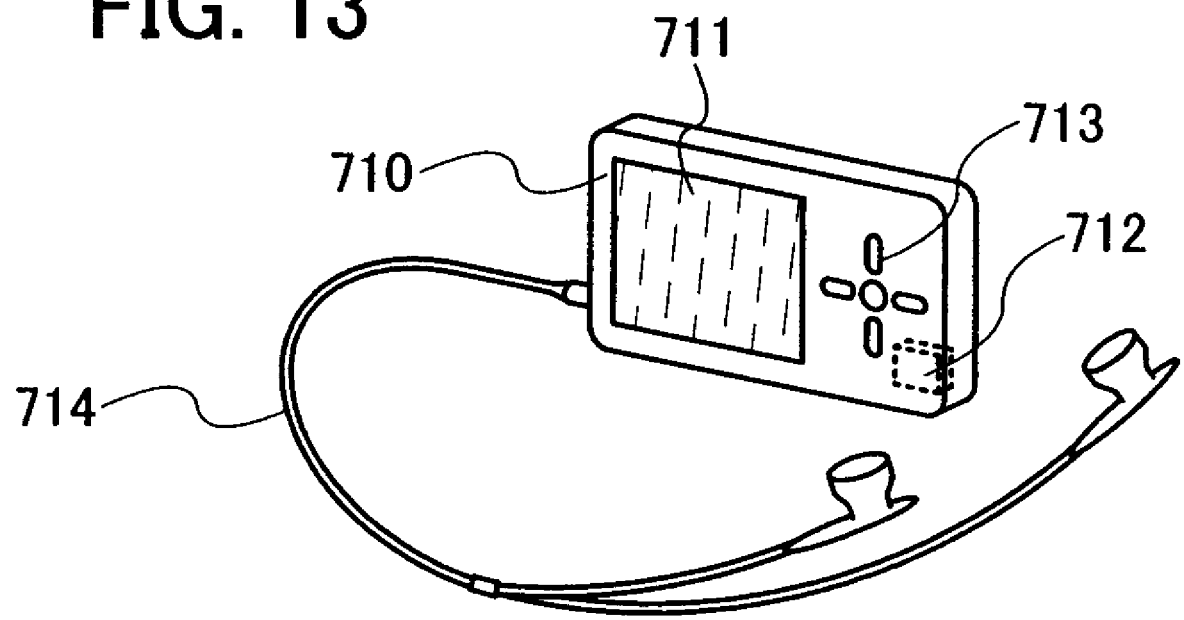
FIG. 13 shows an example of an electronic appliance of the present invention.

FIG. 13 shows a digital player as an example of a sound reproduction device. The digital player shown in FIG. 13 includes a main body 710, a display portion 711, a memory portion 712, an operation portion 713, an earphone 714, and the like. The earphone 714 can be replaced by a headphone or a wireless earphone. The display portion 711 can be formed by using the display device (passive type) shown in Embodiment Mode 3 or the display device (active type) shown in any of Embodiment Modes 4 to 6. This display portion 711 may be formed by a display device of a segment type. In either case, the display portion with reduced power consumption can be formed by using the light-emitting element of the present invention. The memory portion 712 uses a hard disk or a nonvolatile memory. For example, a NAND-type nonvolatile memory with a recording capacity of 20 to 200 gigabytes (GB) is used to operate the operation portion 713, whereby an image and a sound (music) can be recorded or reproduced. When the display portion 702 and the display portion 711 display white characters on a black background, the power consumption can be further reduced. This is particularly effective in a mobile audio device.

As thus described, the application range of the display device manufactured by applying the present invention is quite wide, and this display device can be applied to electronic appliances of every field. With the present invention, the electronic appliance with reduced power consumption can be obtained.

Figure 14:
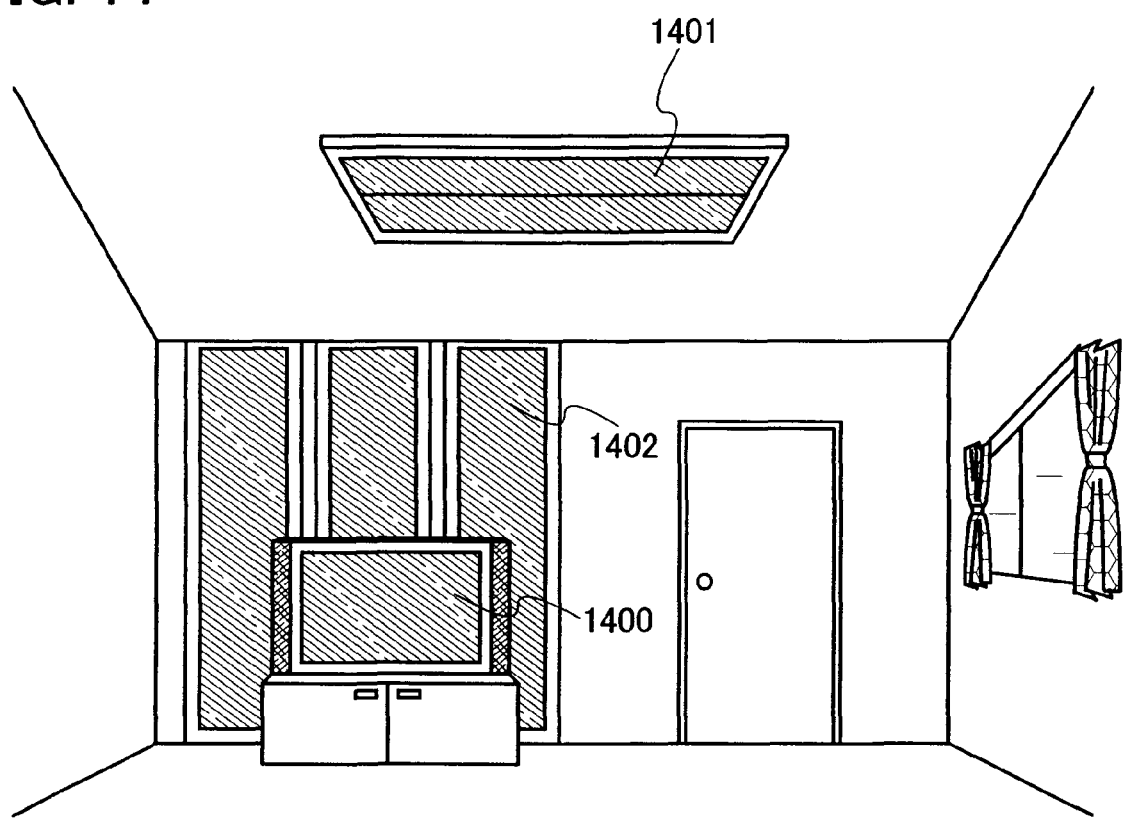
FIG. 14 shows an example of an illumination apparatus of the present invention.
Figure 15:
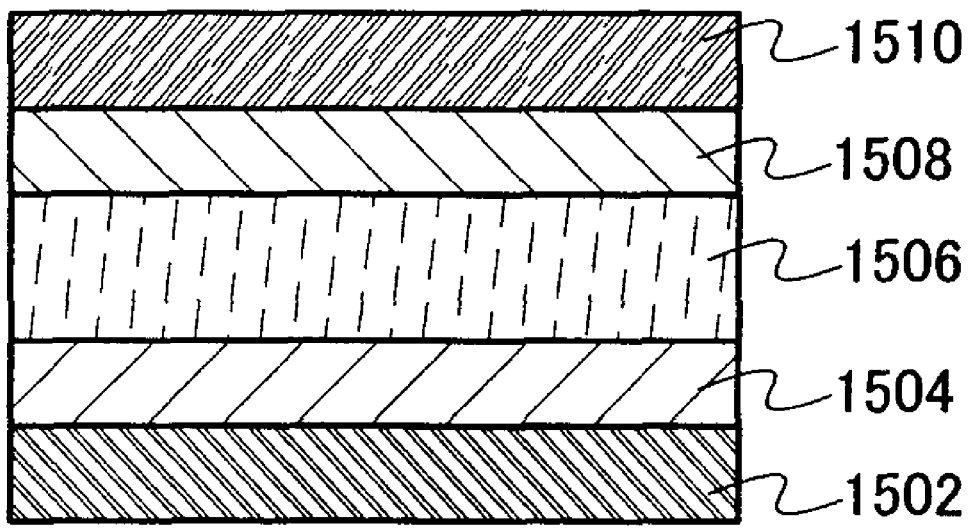
FIG. 15 shows a conventional inorganic light-emitting element.

FIG. 14 shows an example of using the display device of the present invention as an illumination apparatus 1401 and an illumination apparatus 1402 in the room. The illumination apparatus 1401 is attached to the ceiling, while the illumination apparatus 1402 is embedded in the wall. Since the display device of the present invention can be enlarged, the display device can be used as a large-area illumination apparatus. Moreover, since the display device of the present invention consumes less electric power, the display device can be used as the illumination apparatus consuming less electric power. Thus, the television 1400 of the present invention as described with reference to FIG. 10A can be provided in the room using the display device of the present invention as the illumination apparatus 1401, so that pubic broadcasting and movies can be enjoyed. In such a case, since both of the television device and the illumination apparatus consume less electric power, it is possible to enjoy dynamic images in the bright room without worrying about electricity charges.

The illumination apparatus is not limited to that shown in this embodiment mode and the present invention can be applied to illumination apparatuses of various modes including houses and public facilities. In such cases, since the illumination apparatus of the present invention has a light-emitting medium of a thin film form, the degree of freedom in designing the apparatus is high. Accordingly, elaborately designed products can be provided to the market.

This application is based on Japanese Patent Application serial no. 2006-077854 filed in Japan Patent Office on Mar. 21, 2006 and Japanese Patent Application serial no. 2006-104328 filed in Japan Patent Office on Apr. 5, 2006 the entire contents of which are hereby incorporated by reference.

The invention claimed is:

1. A light-emitting element comprising:
a layer containing a light-emitting substance; and
an electron supplying layer which is in contact with the layer containing the light-emitting substance,
wherein the layer containing the light-emitting substance and the electron supplying layer are provided between a first electrode and a second electrode,
wherein the layer containing the light-emitting substance includes at least an impurity element, a halogen element, and a base material which comprises a material selected from the group consisting of a sulfide, an oxide, and a nitride, and
wherein the electron supplying layer includes a substance with a lower work function than that of the base material.

2. A light-emitting element comprising:
a layer containing a light-emitting substance;
an electron supplying layer which is in contact with one surface of the layer containing the light-emitting substance; and
an insulating layer which is in contact with the other surface of the layer containing the light-emitting substance,
wherein the layer containing the light-emitting substance, the electron supplying layer, and the insulating layer are provided between a first electrode and a second electrode,
wherein the layer containing the light-emitting substance includes at least an impurity element, a halogen element, and a base material which comprises a material selected from the group consisting of a sulfide, an oxide, and a nitride, and
wherein the electron supplying layer includes a substance with a lower work function than that of the base material.

3. The light-emitting element according to claim 1 or 2, wherein the impurity element is at least one selected from the group consisting of manganese (Mn), copper (Cu), samarium (Sm), terbium (Tb), erbium (Er), thulium (Tm), europium (Eu), cerium (Ce), and praseodymium (Pr).

4. A light-emitting element comprising:
a layer containing a light-emitting substance; and
an electron supplying layer which is in contact with one surface of the layer containing the light-emitting substance,
wherein the layer containing the light-emitting substance and the electron supplying layer are provided between a first electrode and a second electrode,
wherein the layer containing the light-emitting substance includes at least a first impurity element, a second impurity element, and a base material which comprises a material selected from the group consisting of a sulfide, an oxide, and a nitride,
wherein the electron supplying layer includes a substance with a lower work function than that of the base material, and
wherein the first impurity element is fluorine (F), chlorine (Cl), or aluminum (Al).

5. A light-emitting element comprising:
a layer containing a light-emitting substance; and
an electron supplying layer which is in contact with one surface of the layer containing the light-emitting substance;
wherein the layer containing the light-emitting substance and the electron supplying layer are provided between a first electrode and a second electrode,
wherein the layer containing the light-emitting substance includes at least a first impurity element, a second impurity element, and a base material which comprises a material selected from the group consisting of a sulfide, an oxide, and a nitride,
wherein the electron supplying layer includes a substance with a lower work function than that of the base material, and
wherein the second impurity element is copper (Cu) or silver (Ag).

6. A light-emitting element comprising:
a layer containing a light-emitting substance;
an electron supplying layer which is in contact with one surface of the layer containing the light-emitting substance; and
a hole supplying layer which is in contact with the other surface of the layer containing the light-emitting substance,
wherein the layer containing the light-emitting substance, the electron supplying layer, and the hole supplying layer are provided between a first electrode and a second electrode,
wherein the layer containing the light-emitting substance includes at least a first impurity element, a second impurity element, and a base material which comprises a material selected from the group consisting of a sulfide, an oxide, and a nitride, wherein the electron supplying layer includes a substance with a lower work function than that of the base material, and wherein the hole supplying layer includes a substance with a higher work function than that of the base material.

7. The light-emitting element according to claim 6, wherein the hole supplying layer is formed of a substance with a work function of 4.5 eV or higher.

8. The light-emitting element according to claim 6, wherein the hole supplying layer is formed of at least one selected from the group consisting of beryllium (Be), boron (B), iron (Fe), chromium (Cr), copper (Cu), antimony (Sb), tellurium (Te), tungsten (W), cobalt (Co), nickel (Ni), selenium (Se), palladium (Pd), iridium (Ir), platinum (Pt), gold (Au), a compound thereof and a combination thereof.

9. The light-emitting element according to claim 5 or 6, wherein the first impurity element is fluorine (F), chlorine (Cl), or aluminum (Al).

10. The light-emitting element according to claims 4 or 6, wherein the second impurity element is copper (Cu) or silver (Ag).

11. The light-emitting element according to any one of claims 4 to 6, wherein the layer containing the light-emitting substance further includes manganese (Mn) as a third impurity element.

12. The light-emitting element according to any one of claims 1, 2, 4 to 6, wherein the base material in the layer containing the light-emitting substance is at least one selected from the group consisting of zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), zinc oxide (ZnO), yttrium oxide ($Y_2O_3$), aluminum nitride (AlN), gallium nitride (GaN), indium nitirde (InN), zinc selenide (ZnSe), zinc telluride (ZnTe), $CaGa_2S_4$, $SrGa_2S_4$, $BaGa_2S_4$, $BaAl_2S_4$, $CaAl_2S_4$, and $SrCaY_2S_4$.

13. The light-emitting element according to any one of claims 1, 2, 4 to 6, wherein the electron supplying layer is formed of a substance with a work function of 4 eV or lower.

14. The light-emitting element according to any one of claims 1, 2, 4 to 6, wherein the electron supplying layer is formed of at least one selected from the group consisting of an alkali metal such as lithium (Li), sodium (Na), potassium (K), or cesium (Cs), an alkaline earth metal such as magnesium (Mg), calcium (Ca), strontium (Sr), or barium (Ba), scandium (Sc), arsenic (As), yttrium (Y), lanthanum (La), hafnium (Hf), a compound including thereof and a combination thereof.

15. The light-emitting element according to any one of claims 1 2, 4 to 6, wherein the electron supplying layer is formed of a substance with negative electron affinity such as diamond or aluminum nitride (AlN).

16. A display device comprising the light-emitting element according to any one of claims 1, 2, 4 to 6.

17. An electronic appliance comprising the light-emitting element according to any one of claims 1, 2, 4 to 6 in a display portion.

18. The light-emitting element according to claim 1 or 2, wherein the halogen element is at least one of fluorine (F) and chlorine (Cl).

19. The light-emitting element according to claim 4 or 5, further comprising an insulating layer which is in contact with the other surface of the layer containing the light-emitting substance.

\* \* \* \* \*